(12) United States Patent
Moehlmann et al.

(10) Patent No.: US 7,557,623 B2
(45) Date of Patent: Jul. 7, 2009

(54) CIRCUIT ARRANGEMENT, IN PARTICULAR PHASE-LOCKED LOOP, AS WELL AS CORRESPONDING METHOD

(75) Inventors: Ulrich Moehlmann, Moisburg (DE); Timo Giesselmann, Hamburg (DE); Edwin Schapendonk, Oss (NL); Frank Brand, Harsefeld (DE); Leendert Albertus Dick Van Den Broeke, Malden (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/911,860

(22) PCT Filed: Apr. 13, 2006

(86) PCT No.: PCT/IB2006/051156

§ 371 (c)(1),
(2), (4) Date: Oct. 18, 2007

(87) PCT Pub. No.: WO2006/111899

PCT Pub. Date: Oct. 26, 2006

(65) Prior Publication Data

US 2008/0204092 A1    Aug. 28, 2008

(30) Foreign Application Priority Data

Apr. 18, 2005   (EP) ................................ 05103069

(51) Int. Cl.
*H03L 7/06*   (2006.01)
(52) U.S. Cl. ...................................... 327/156; 327/147
(58) Field of Classification Search ........................ None
See application file for complete search history.

(56) References Cited

U.S. PATENT DOCUMENTS 5,796,392 A    8/1998   Eglit
5,832,048 A    11/1998  Woodman, Jr.
(Continued)

FOREIGN PATENT DOCUMENTS

| EP | 0899879 A2 | 8/1998 |
|---|---|---|
| EP | 0619653 B1 | 12/1998 |
| WO | 9913579 A1 | 3/1999 |

*Primary Examiner*—Cassandra Cox

(57) ABSTRACT

In order to further develop a circuit arrangement (100), in particular to a phase-locked loop for sub-clock or sub-pixel accurate phase-measurement and phase-generation, as well as a corresponding method in such way that no clock multiplier phase-locked loop is to be provided behind the time-to-digital converter and that neither an analog delay line nor a signal divider unit is to be provided between the digital ramp oscillator or discrete time oscillator and the digital-to-time converter, wherein less analog circuitry is susceptible for noise and for ground bounce in the digital environment, it is proposed to provide at least one phase measurement unit (10);—at least one loop filter unit (40; 40') being provided with at least one output signal (delta-phi) of at least one phase detector unit (30); at least one digital ramp oscillator unit or discrete time oscillator unit (50; 50') being provided with at least one output signal, in particular with at least one increment (inc), of the loop filter unit (40; 40'), the status signal (dto-status) of at least one register unit (54; 54') of the digital ramp oscillator unit or discrete time oscillator unit (50; 50') being fed back as input signal to the phase detector unit (30); and at least one digital-to-time converter unit (60, 62; 60', 62') being provided with at least one output signal (dto-co) of the digital ramp oscillator unit or discrete time oscillator unit (50; 50') and generating at least one output signal (ho1, ho2).

10 Claims, 20 Drawing Sheets

U.S. PATENT DOCUMENTS

Figure 1:
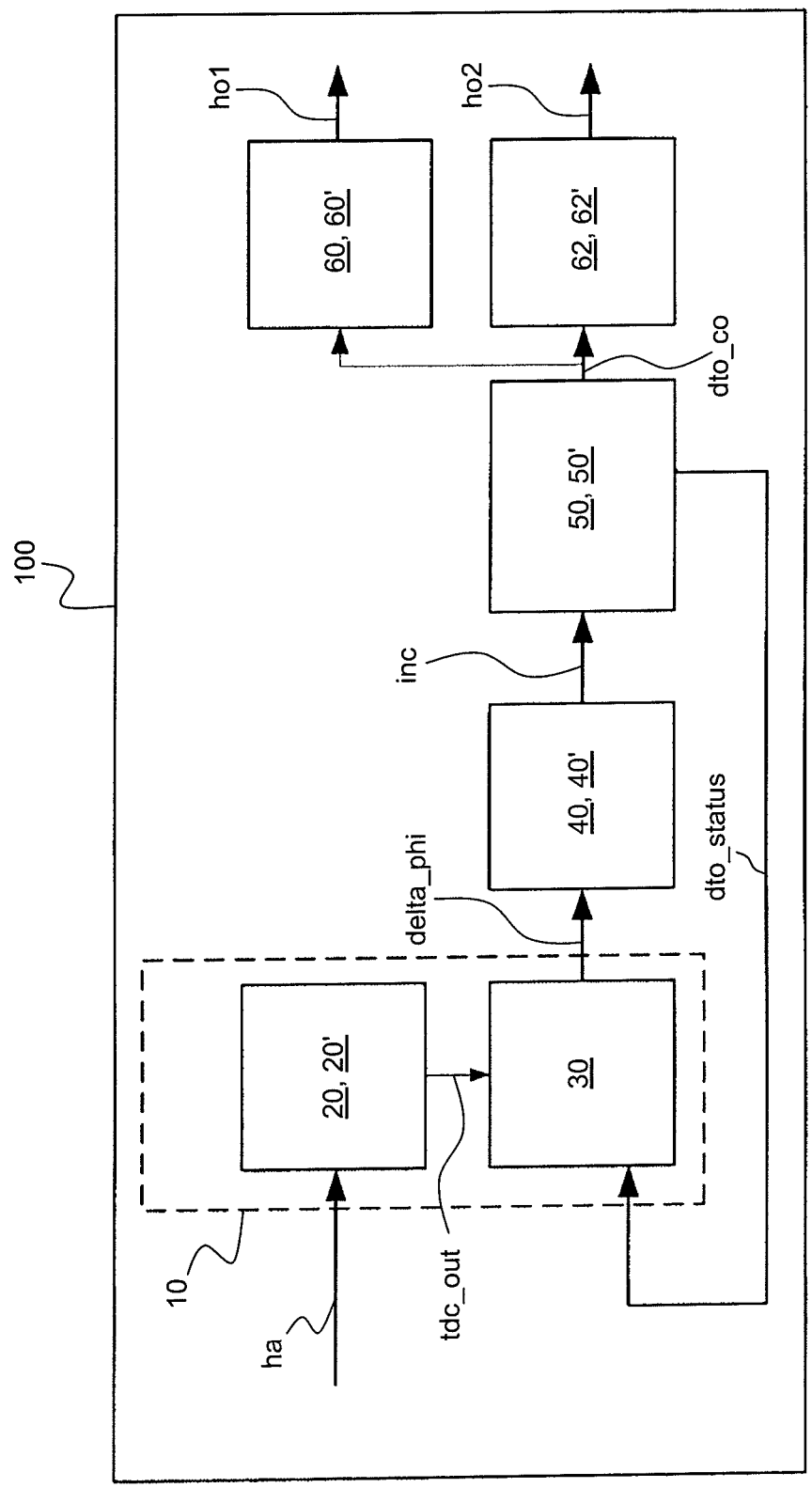

| | | |
|---|---|---|
| 6,133,900 A | 10/2000 | Esaki |
| 6,232,952 B1 | 5/2001 | Eglit |
| 6,320,574 B1 | 11/2001 | Eglit |
| 6,603,362 B2 * | 8/2003 | Von Dolteren, Jr. ........... 331/25 |
| 7,061,276 B2 * | 6/2006 | Xu ................................ 327/2 |
| 2002/0033737 A1 | 3/2002 | Staszewski et al. |
| 2002/0191727 A1 | 12/2002 | Staszewski et al. |
| 2003/0174797 A1 | 9/2003 | Grushin |

* cited by examiner

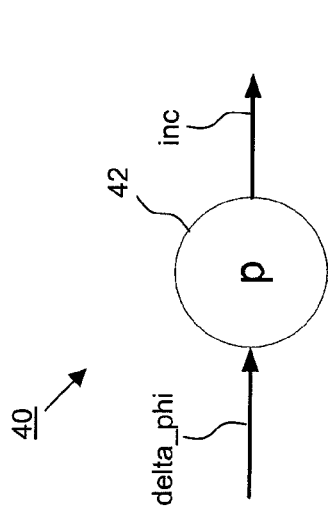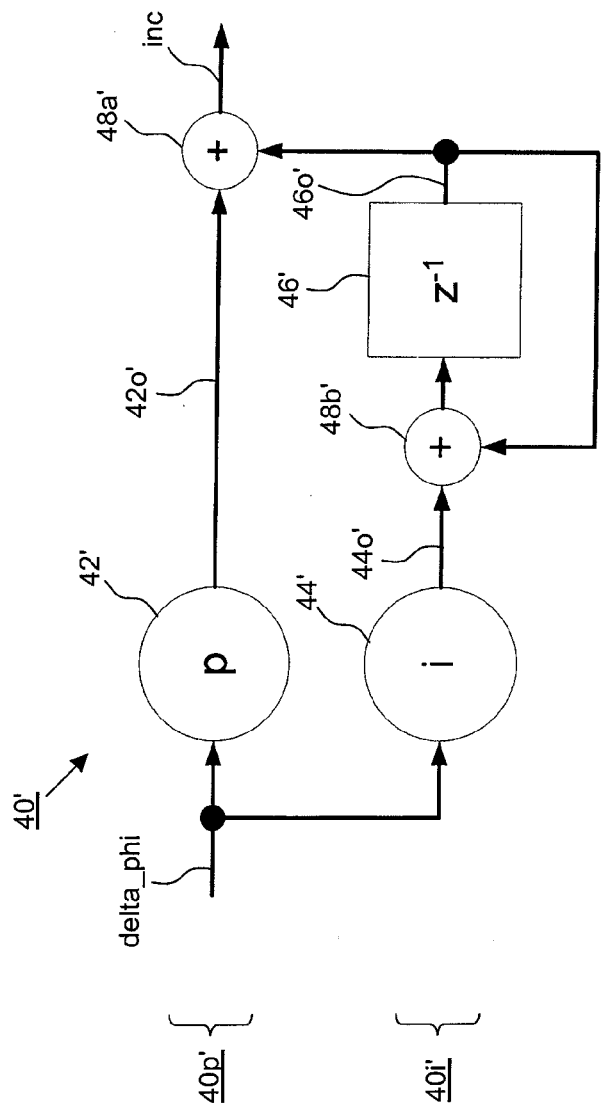

CIRCUIT ARRANGEMENT, IN PARTICULAR PHASE-LOCKED LOOP, AS WELL AS CORRESPONDING METHOD

The present invention relates to a circuit arrangement, in particular to a phase-locked loop for sub-clock or sub-pixel accurate phase-measurement and phase-generation, as well as to a corresponding method.

In digital circuits there is the need to generate a clock signal to trigger latch units (FFs), in particular flip flops, in the digital core or sample and hold gates in analog-to-digital converters (ADC). In many cases it is sufficient to derive this clock from a crystal oscillator.

In cases where the clock needs to have a certain frequency relation or phase relation to an input signal the clock generation has to be controlled. This is the application area of frequency-locked loops (FLL), phase-locked loops (PLL) or delay-locked loops (DLL).

The approach for such a controlling loop can be done in the analog domain or in the digital domain. In the analog domain the time constant of the loop cannot be too long because noise, leakage and other effects would spoil the performance in this case.

In case of a digital approach there is still an analog interface; this analog interface has to be designed such that effort and risk are minimized.

In the past there have been a couple of different approaches in one of which a cascaded P[hase-]L[ocked]L[oop] system is used. A slow and adjustable outer loop is part of the digital domain. The inner loop is analog and locks to the output signal of the outer loop. The inner loop acts as interface between the digital part and the analog environment and provides an enhancement of the resolution of the phase to subclock resolution in general or subpixel resolution in case of video processing.

Disadvantageous here is the very big and dedicated analog part, which can be transferred to another process only with significant effort. A further disadvantage of the use of the cascaded P[hase-]L[ocked]L[oop] system concerns the performance, especially the linearity, and the process dependency as well as the temperature dependency of the analog part.

This approach is discussed in prior art document EP 0 619 653 A1 referring to a digital phase-locked loop and in prior art document EP 0 899 879 A2 referring to a ring oscillator. Jitter values of 200 picoseconds to one nanosecond have been achieved with this implementation. Unfortunately the jitter amplitude is depending on the input frequency, on the operation point, on the temperature, and on the process of the PLL and is not predictable within the mentioned margin.

A further step has been done in a prior art design where no ring oscillator is used for resolution enhancement to subpixel resolution and for analog phase generation but a delay line instead. This delay line is used as reference for a time-to-digital converter (TDC) and for a digital-to-time converter (DTC):

The time-to-digital converter is a circuit measuring the phase of an input reference edge with respect to the reference clock edge being the input clock of the delay line. The output of the time-to-digital converter is a digital word.

The digital-to-time converter is a circuit just doing the opposite, i. e. the digital-to-time converter generates an analog output phase with respect to a digital word at the input. It just selects one of the output phases of the delay line.

Compared to the ring oscillator being realized in Picture Improved Combined Network (PICNIC) and its successors this delay line has the advantage that there are less problems with temperature dependence and process dependence and with linearity. There is still a problem with linearity because here a 64-stage delay line is used; it is very difficult to align 64 stages. Furthermore the step between the last stage and the first stage causes problems in linearity.

The reference clock for the delay line has to have a jitter being significantly lower than subpixel resolution. To achieve this in a digital circuit is rather difficult due to ground bouncing issues. Again the delay line is a dedicated analog block; so transfer from one process to another process generates the same issues as before. Furthermore a clock multiplier PLL is implemented before the delay line to provide an input frequency to the delay line with a sufficient high frequency. This is also an analog block which might also contribute jitter.

A new approach for digital clock synthesis is used in the project Ultimate One Chip-TV 5 (UOC-5; internal denotation: Progressive Picasso or ProPic) where the controlling loop as well as the method for generating the subpixel resolution is completely different. In this approach the three phases of the ring oscillator in the clock multiplier phase-locked loop are used directly to achieve the required subpixel resolution; so there is no delay line and no ring oscillator in the digital phase-locked loop necessary any more.

The clock multiplier PLL is operating on a significantly higher frequency instead to achieve the resolution; this provides more flexibility to scale the digital PLL to other processes. Furthermore this approach removes a significant analog part in the system and there is no signal divider anymore to generate the input for the digital-to-time converter. Such signal divider would be complex, would cost cycle times, would introduce rounding error and would limit the possible output frequency; this has been replaced by a so-called discrete time oscillator or oscilloscope digital time oscillator (DTO).

One disadvantage is that certain types of prior art systems are built for three phases with three being no power of two. The choice of three phases is related to the availability of an analog PLL providing this number of phases. Anyway, the principle can be applied with any number of phases, preferably being a power of two, for example four ($=2^2$) or eight ($=2^3$), thus avoiding a rounding error being generated by rescaling the phase word; this would reduce the frequency of the PLL. To get a higher resolution this system could also be used with six phases.

Apart from that, prior art document US 2002/0033737 A1 refers to a system and a method for time dithering a digitally controlled oscillator tuning input. This technique of time dithering a fully digitally controlled oscillator (DCO) tuning input employs a shift register and a multiplexer responsive to a sigma-delta modulated delay control to minimize spurious tones generated by the digitally controlled oscillator.

The shift register in prior art document US 2002/0033737 A1 is clocked via a divided-down high frequency reference provided by the DCO output signal. The multiplexer is clocked via a frequency reference being reclocked and synchronized to the DCO output signal. The multiplexer output is thus time dithered in response to a delay control to minimize perturbations caused by switching.

Prior art document WO 99/13579 A1 discloses a digital PLL circuit with increased time resolution. The digital PLL circuit comprises a phase detector receiving an external synchronization signal and a first feedback signal and producing a phase difference signal. The value of said phase difference signal is a measure of the phase difference between a synchronization signal and the first feedback signal.

The circuit according to prior art document WO 99/13579 A1 also comprises a digital time oscillator (DTO) which is connected downstream from the phase detector, said DTO producing an n-bit wide digital output signal according to the phase difference signal, a feedback device for conveying the output signal of the DTO to the phase detector as a first feedback signal, and a decoding device being connected to the output of the DTO and having an output for a correction signal. Said correction signal represents a measure of the phase relation between two scanning values and is derived from at least a subset of the bits of the second feedback signal.

The digital PLL circuit according to prior art document WO 99/13579 A1 is particularly useful for regenerating horizontal synchronization in televisions, using the pixel timing.

Prior art document U.S. Pat. No. 6,133,900 refers to an OSD device capable of maintaining the size of displayed OSD data at a constant in a multisync(ronisation) monitor regardless of a frequency of a horizontal synchronous signal. An OSD clock generating circuit includes a PLL circuit controlled to oscillate to generate an OSD clock signal phase-locked with a level transition point of a horizontal synchronous signal.

When the OSD device according to prior art document U.S. Pat. No. 6,133,900 is used in a multisync(ronisation) monitor capable of changing its horizontal synchronous signal frequency, the OSD data can be displayed with the same size without being influenced by a change of the frequency of the horizontal synchronous signal.

Prior art document U.S. Pat. No. 5,832,048 reveals a digital phase-lock loop control system. A phase-locked loop implemented in all-digital components uses a stochastic approach to detect errors in phase position and relative velocity.

Using a history circuit and an adjustment-intensity selection circuit appropriate corrections in phase and frequency are made. The history circuit keeps a running record of a series of binary results ("0" or "1") as received from a phase comparator. History components collected include the number of consecutive oscillator periods in which the phase offset ("0" or "1") has remained the same and the number of oscillator periods in which the phase offset count has not exceeded "1".

Starting from the disadvantages and shortcomings as described above and taking the prior art as discussed into account, an object of the present invention is to further develop a circuit arrangement of the kind as described in the technical field as well as a method of the kind as described in the technical field, in such way that no clock multiplier phase-locked loop is to be provided behind the time-to-digital converter and that neither an analog delay line nor a signal divider unit is to be provided between the digital ramp oscillator or discrete time oscillator and the digital-to-time converter, wherein less analog circuitry is susceptible for noise and for ground bounce in the digital environment.

The object of the present invention is achieved by a circuit arrangement comprising the features of claim 1 as well as by a method comprising the features of claim 8. Advantageous embodiments and expedient improvements of the present invention are disclosed in the respective dependent claims.

The present invention is principally based on a circuit for as well as on a method for sub-clock and/or sub-pixel accurate phase measurement and phase generation. This new kind of sub-clock and/or sub-pixel accurate phase measurement and phase generation method and circuit can be used for digital clock synthesis and/or for completely digital generation of reference signals like line sync(ronisation) signals for the display part of a digital video processor.

This principle can be used in every application where clocks or reference signals are derived from the frequency or from the phase from an input signal; so this can be seen as general approach for solving this issue.

To this aim, a digital clock circuit in the G[iga]H[ert]z-range is used where the clock signal is derived from the phase from an input signal, and where the circuit is fully digitalized. The circuit preferably has no clock multiplier PLL behind the digital-to-time converter (DTC), no analog delay line and no signal divider between the discrete time oscillator (DTO) and the digital-to-time converter (DTC). The advantage of this solution is that in a digital environment there is less analog circuitry being susceptible for noise and for ground bounce.

This kind of clock generation can be used to generate any clock signal dependent on or independent of an input reference signal. The output frequency of the oscilloscope or digital time oscillator (DTO) is determined by the increment inc controlling the DTO frequency $f_{DTO}$ according to the equation $f_{DTO}=f_{xtal} \cdot inc/dto\_max$. So any rational ratio between the increment inc and the maximum content or maximum value dto_max of the discrete time oscillator or oscilloscope digital time oscillator can be realized.

If the increment inc is modulated from clock to clock also "dithering" to a higher frequency resolution is possible. The frequency of the virtual clock grid determines the minimum possible jitter.

According to a preferred embodiment of the present invention, different implementations of the discrete time oscillator or oscilloscope discrete time oscillator (DTO) can be provided; this shows that there is a lot of freedom to derive different output signals with less additional effort from the same source without using an analog clock multiplier phase-locked loop.

According to a particularly inventive refinement of the present invention, it is not necessary to apply the new digital-to-time converter/time-to-digital converter approach to a digital phase-locked loop; this DTC/TDC approach can also be used for direct frequency synthesis. In this case the interface to any other system can be the increment inc of the discrete time oscillator or oscilloscope discrete time oscillator (DTO) or also phase image of the DTO directly. The phase image can also be generated for example by software.

The advantages of the new approach according to the teaching of the present invention can be summarized as follows:

the output signal is available on fixed clock grid with high resolution in the nanosecond range and/or in the picosecond range;

there is no clock multiplier phase-locked loop necessary behind the digital-to-time converter as in prior art systems;

there is no analog delay line;

there is no signal divider between the oscilloscope/digital time oscillator and the digital-to-time converter;

easy transfer of the design to new silicon process technologies, in particular easy process shrink.

In general, the present invention can be applied for digital clock synthesis and/or for completely digital generation of reference signals like line sync(ronisation) signals for the display part of a digital video processor. The principle according to the teaching of the present invention can be used in every application where clocks or reference signals are derived from the frequency or from the phase from an input signal, for instance in the field of semiconductor audio/video standard, like T[ele]V[ision] including motion estimation etc. platforms where general processor features, such as L[iquid] C[rystal]D[isplay]-T[ele]V[ision] are relevant.

Figure 4:
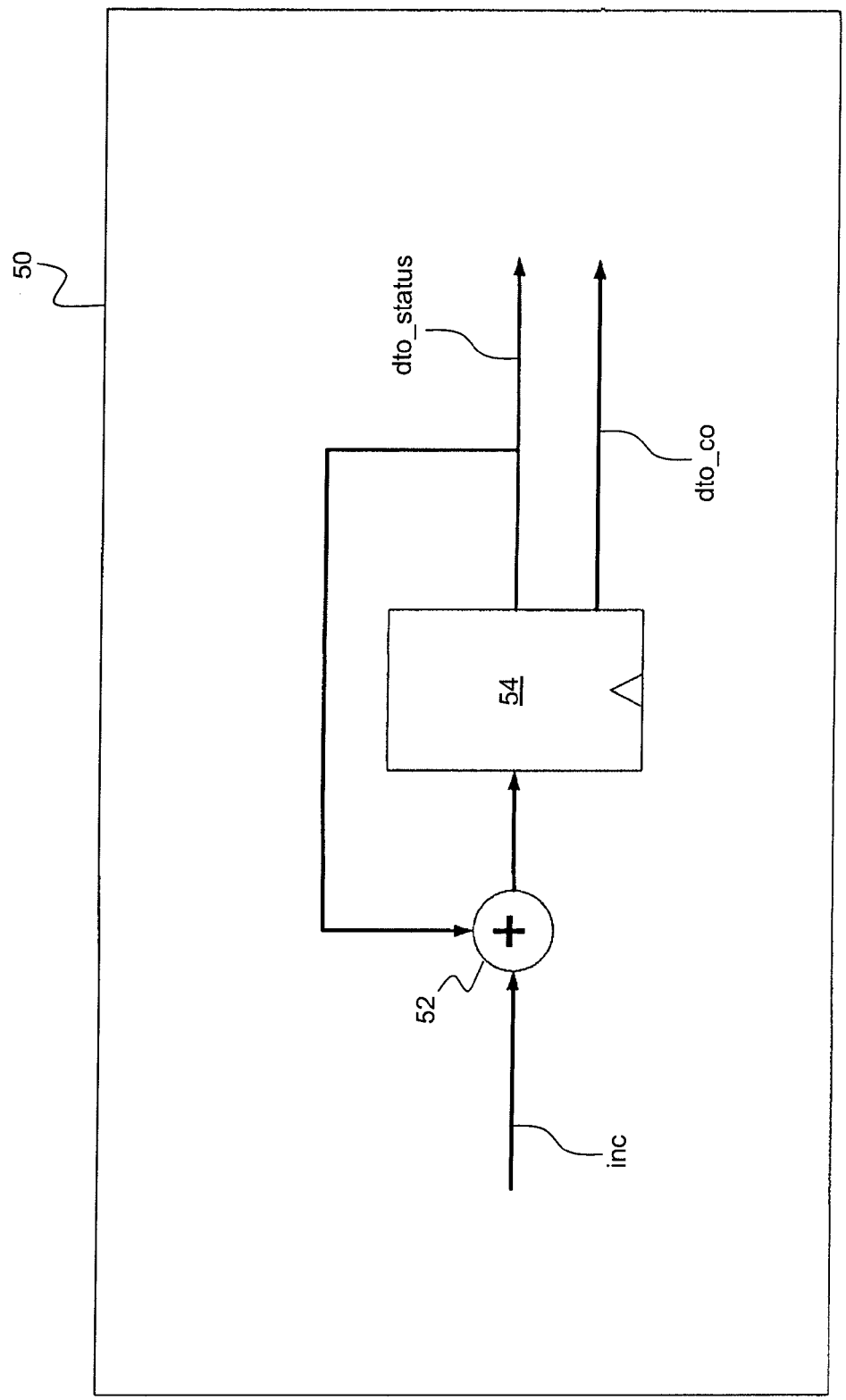
Figure 5:
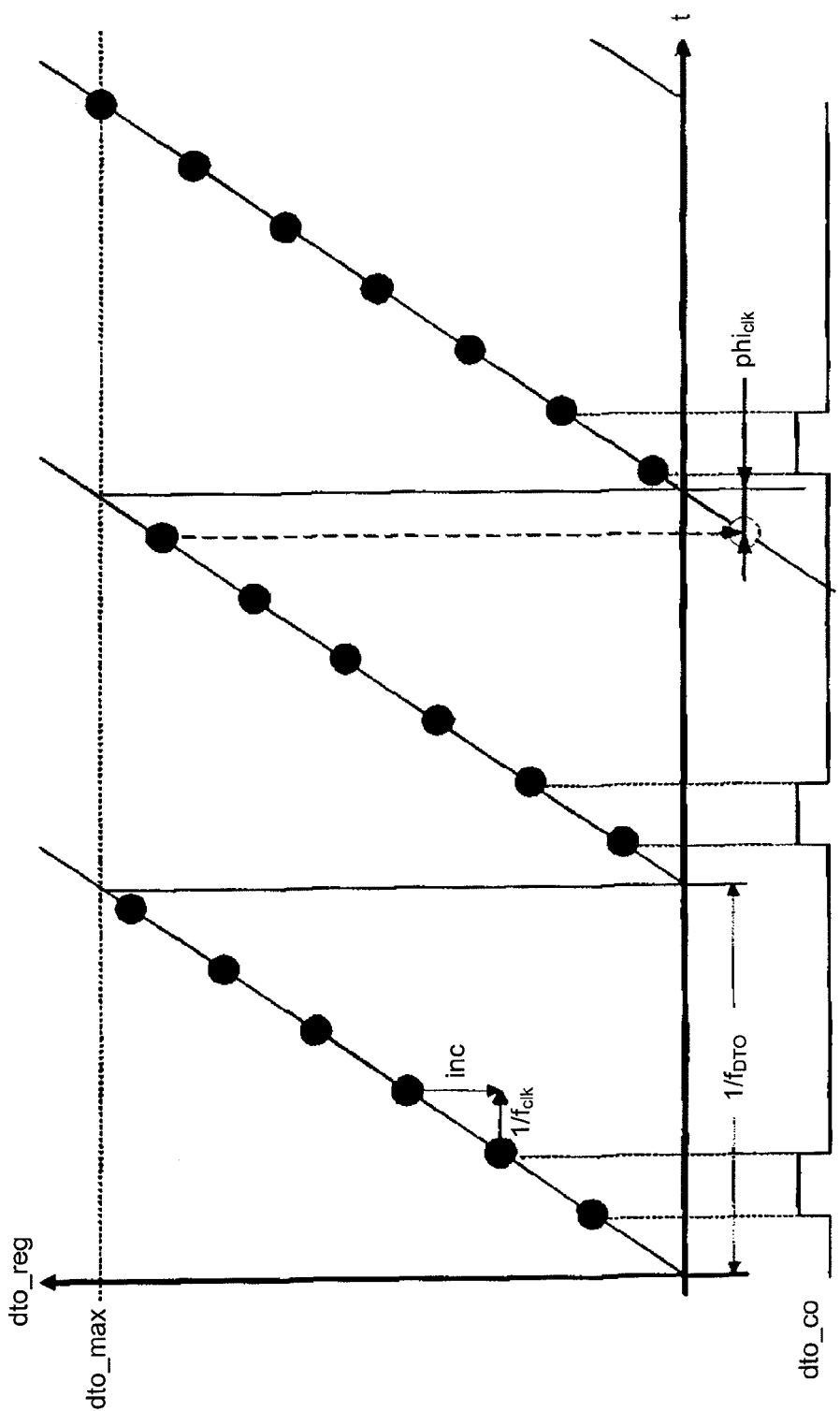
Figure 6:
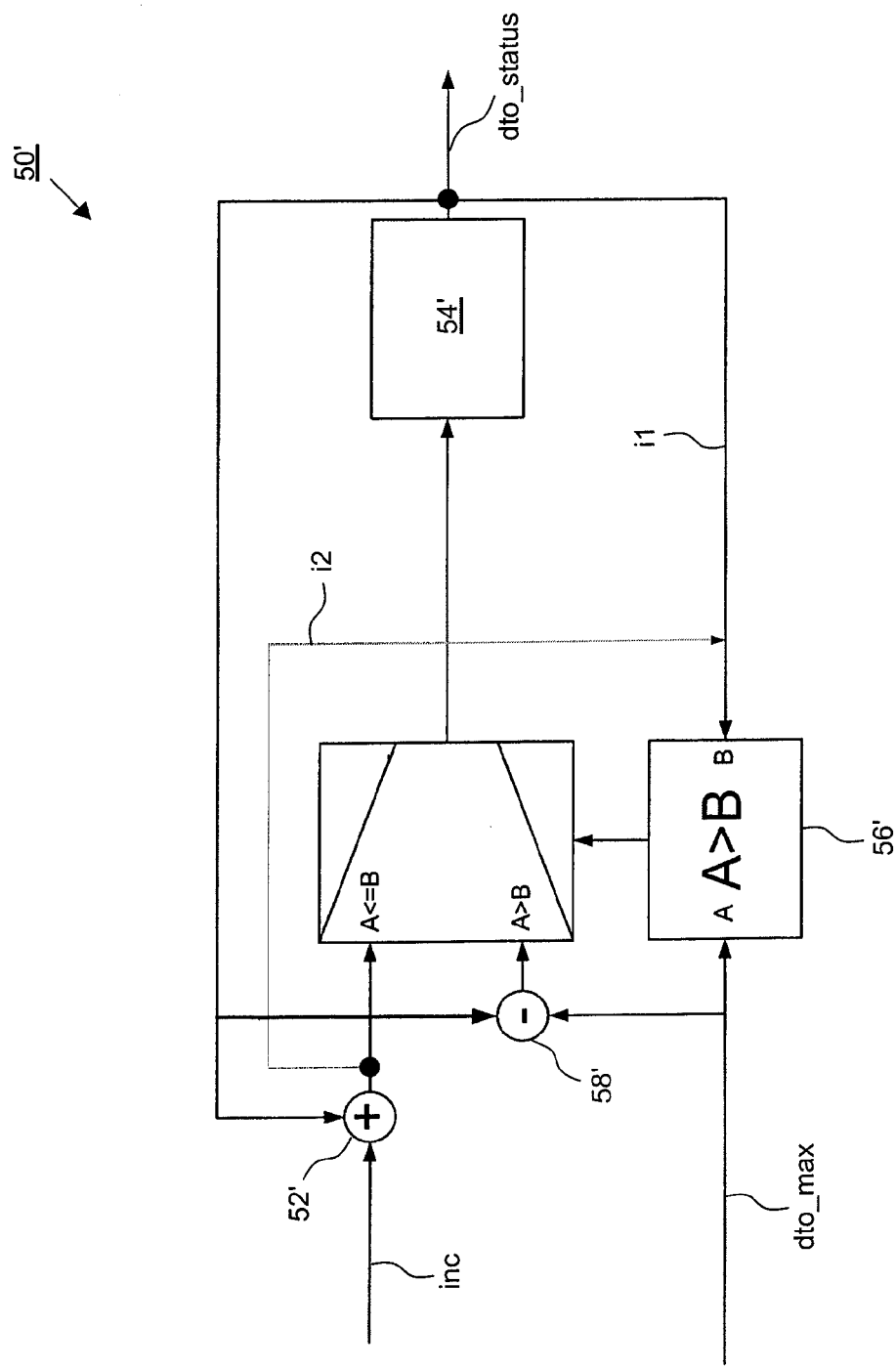
Figure 7:
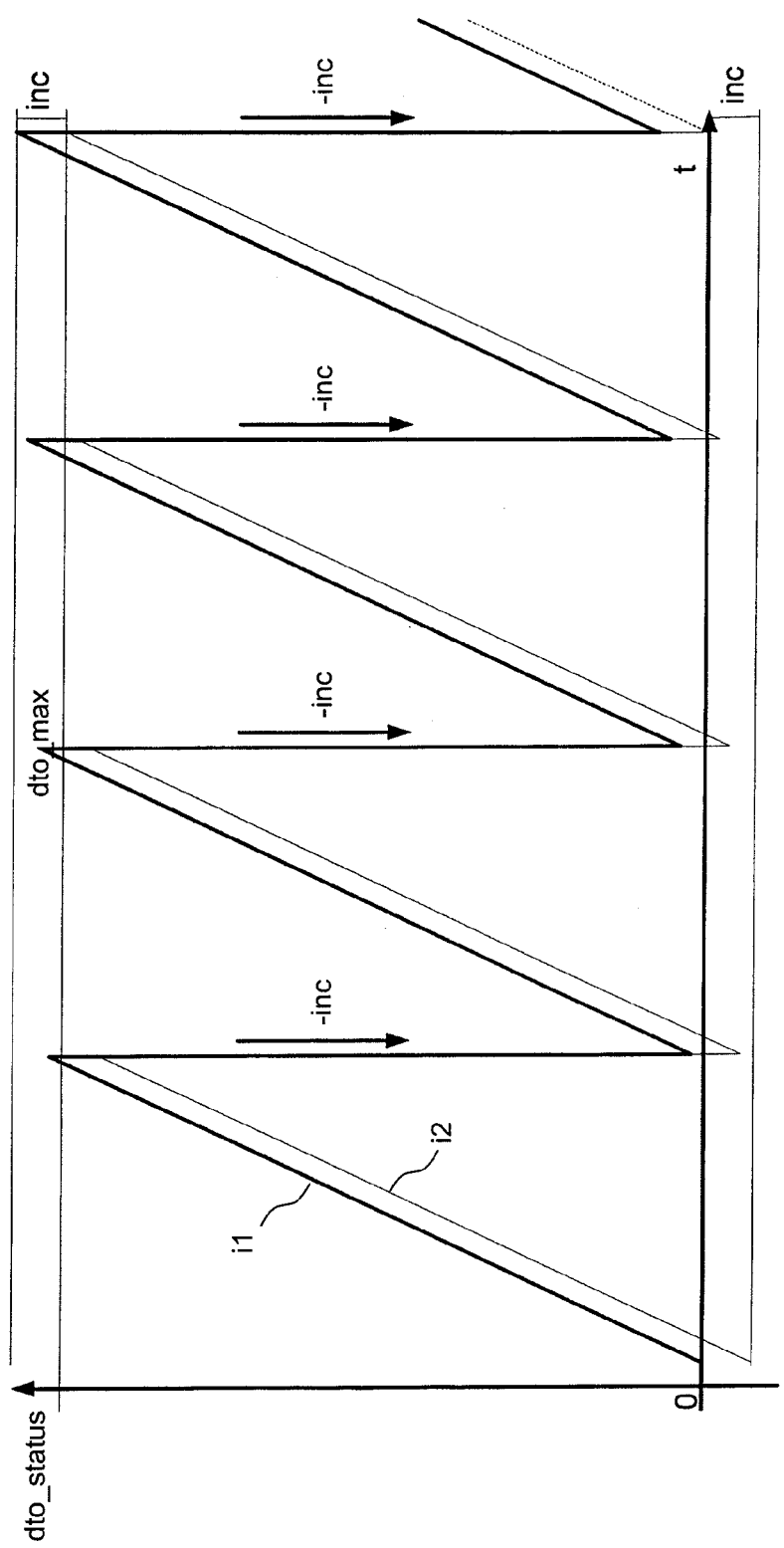
Figure 8:
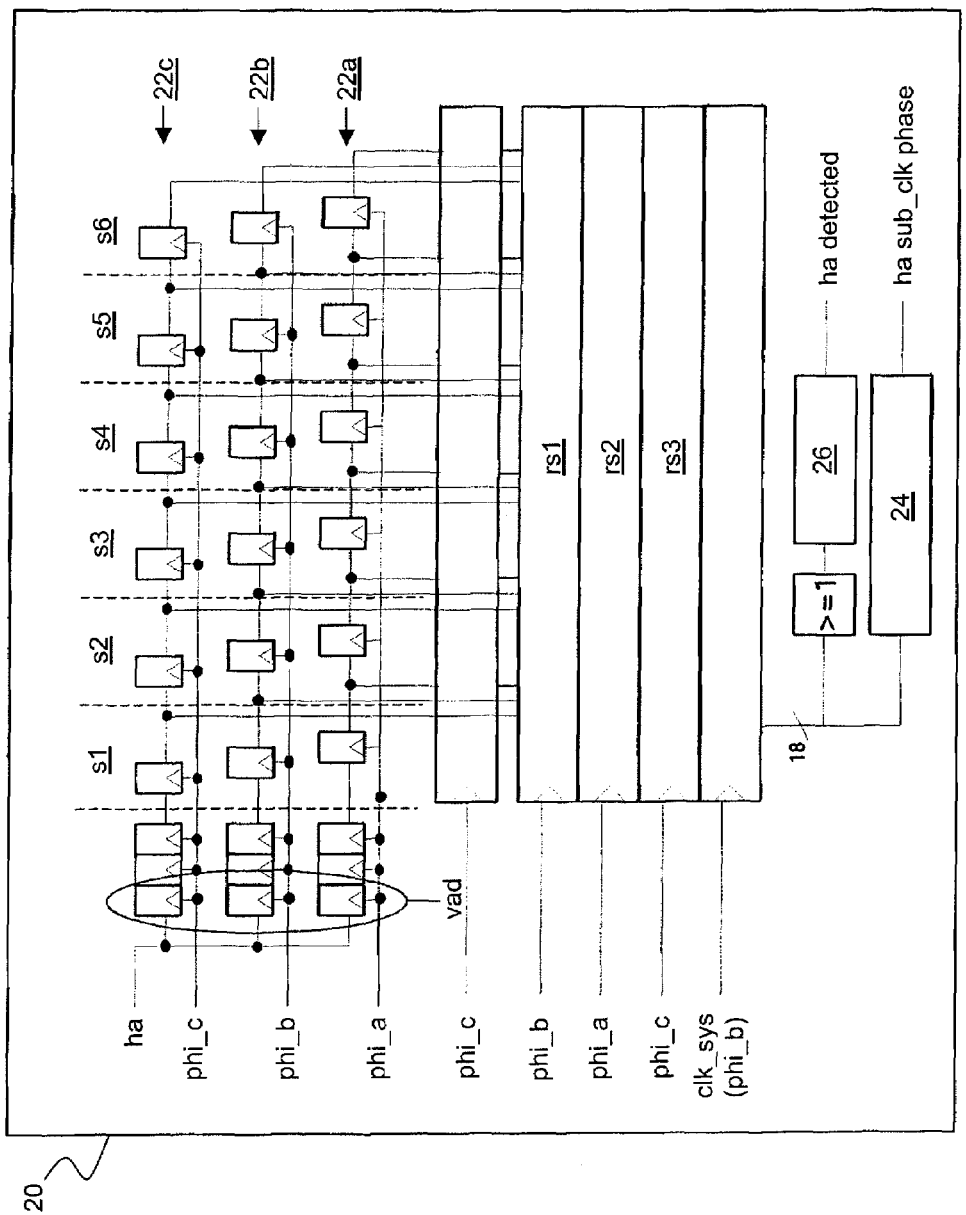
Figure 9:
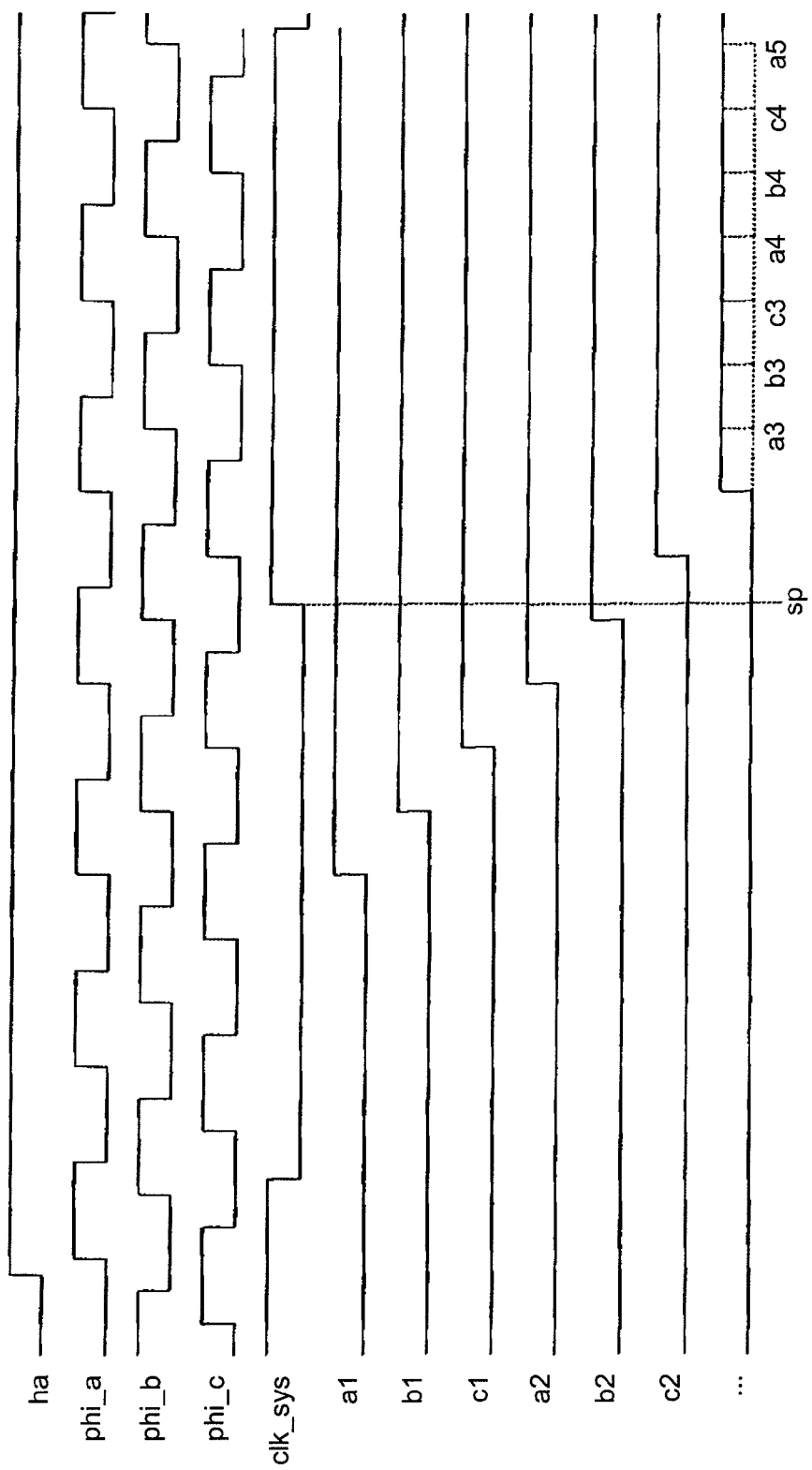
Figure 10:
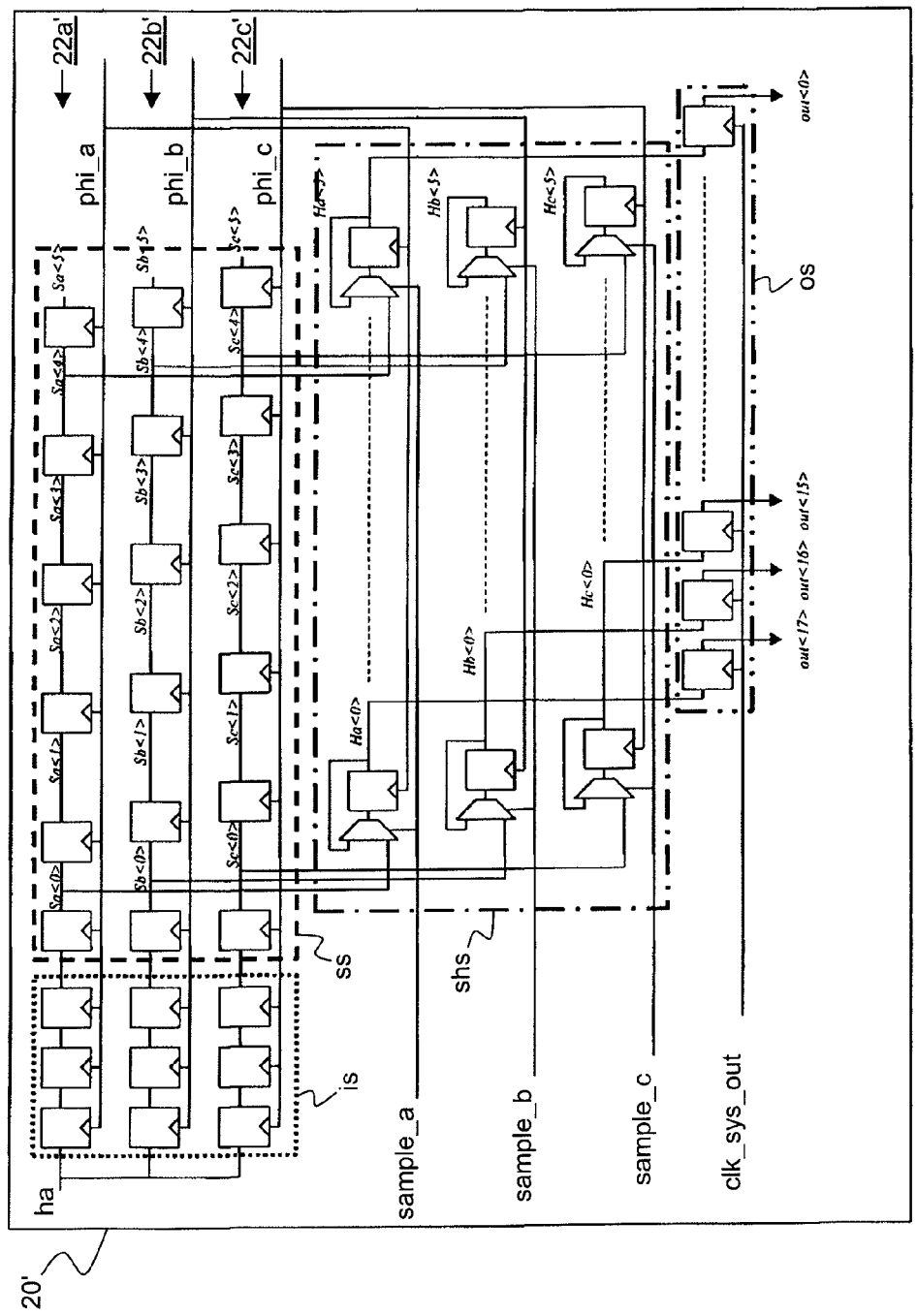
Figure 11:
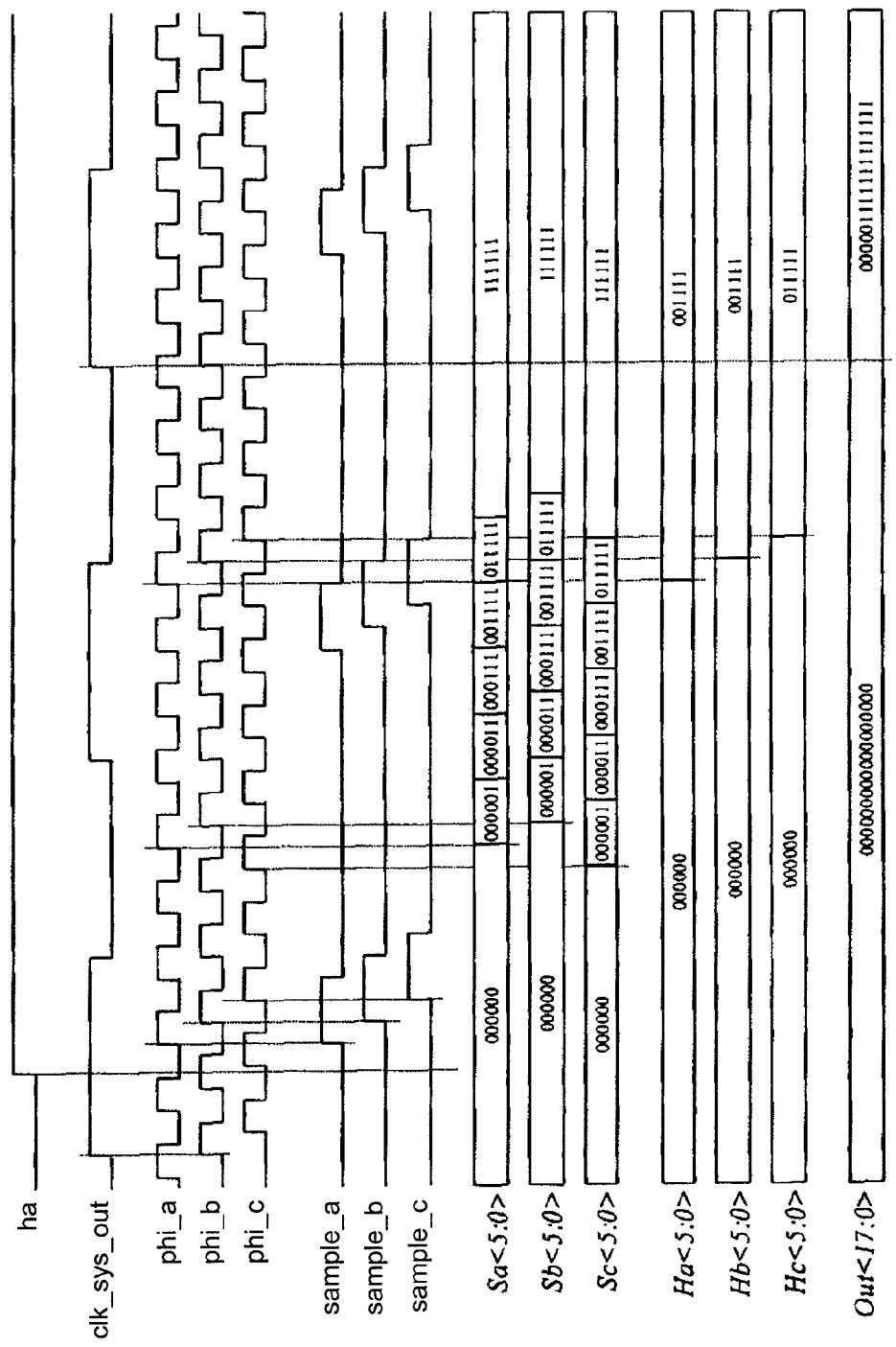
Figure 12:
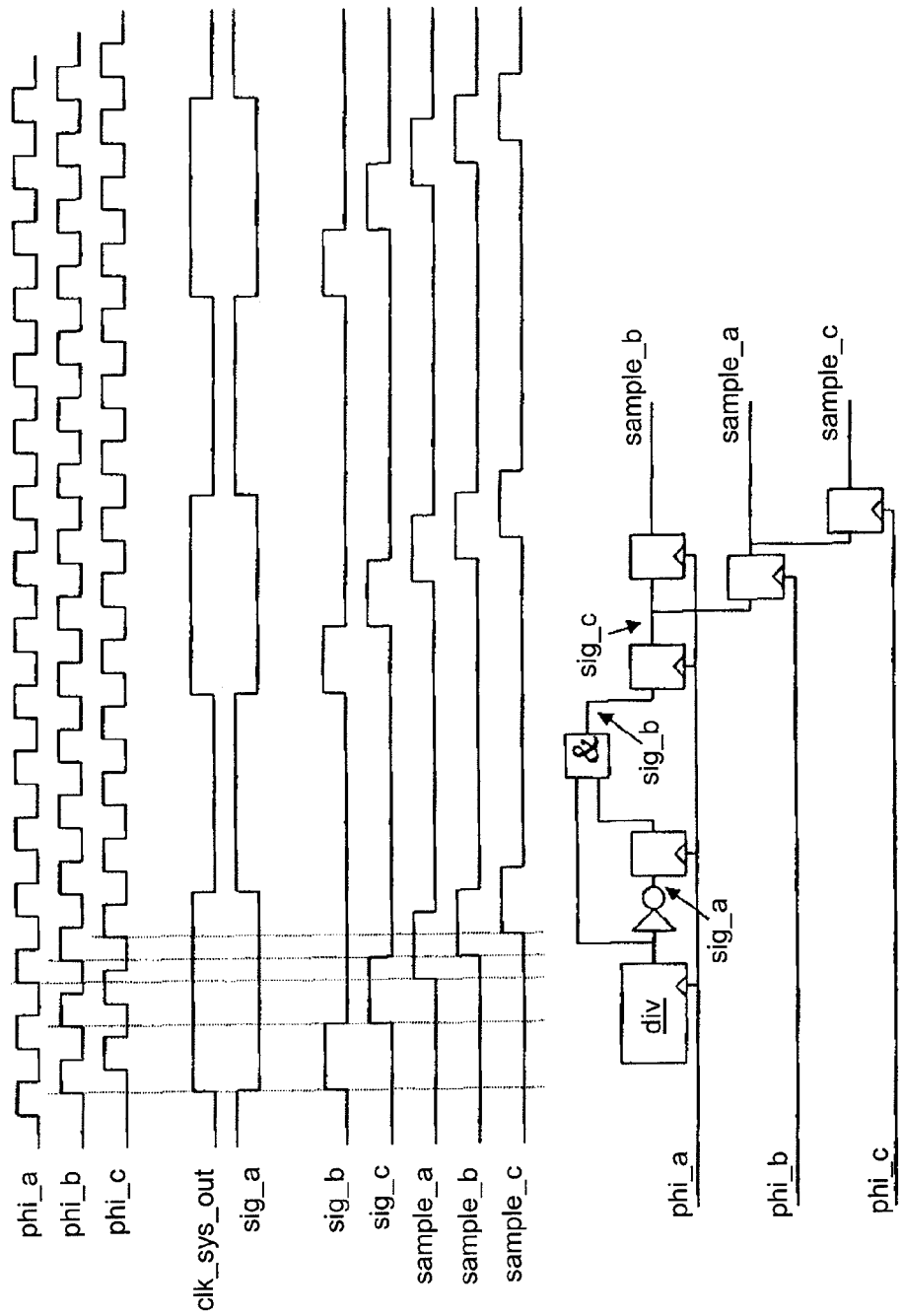
Figure 13:
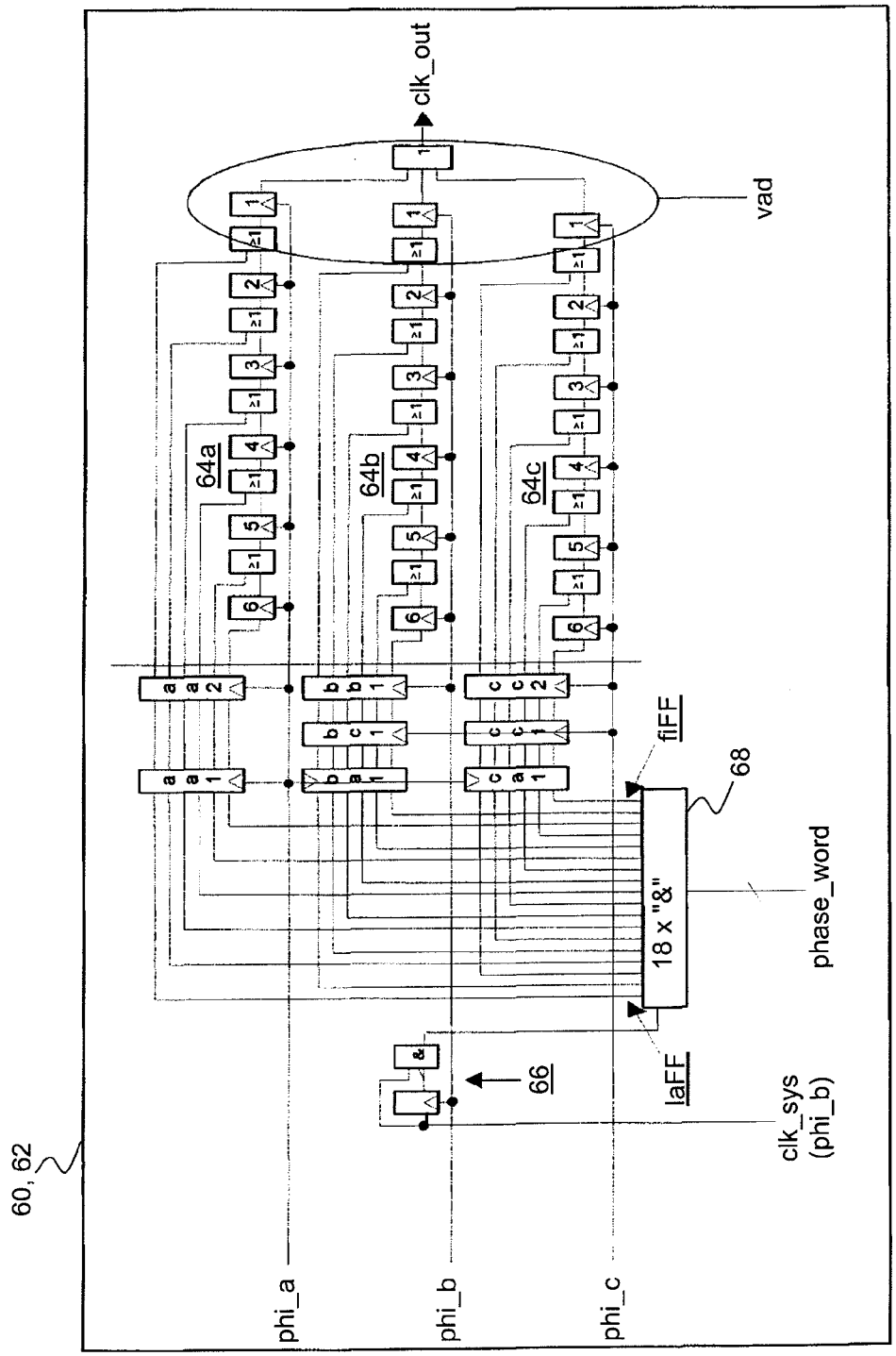
Figure 14:
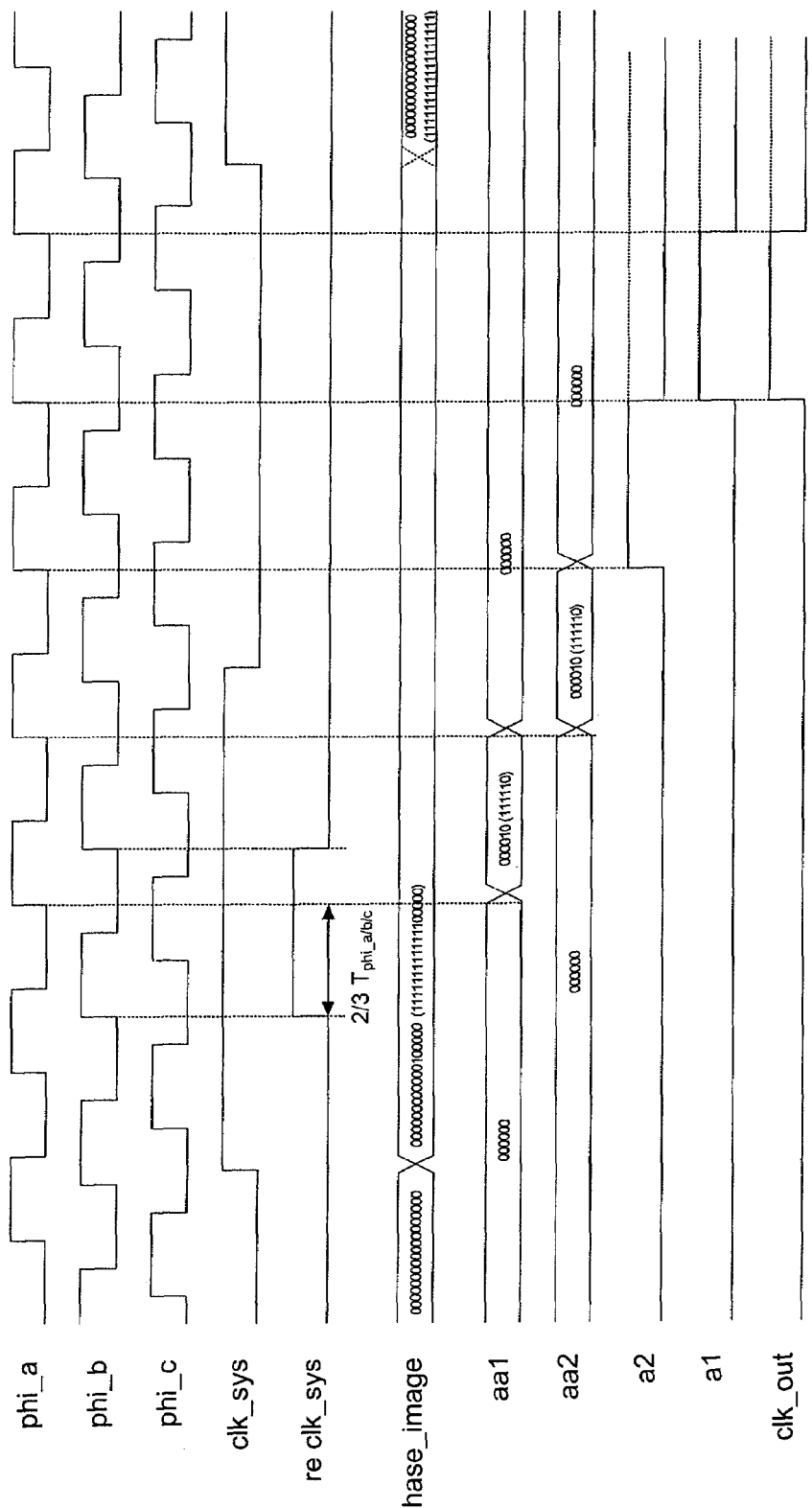
Figure 15:
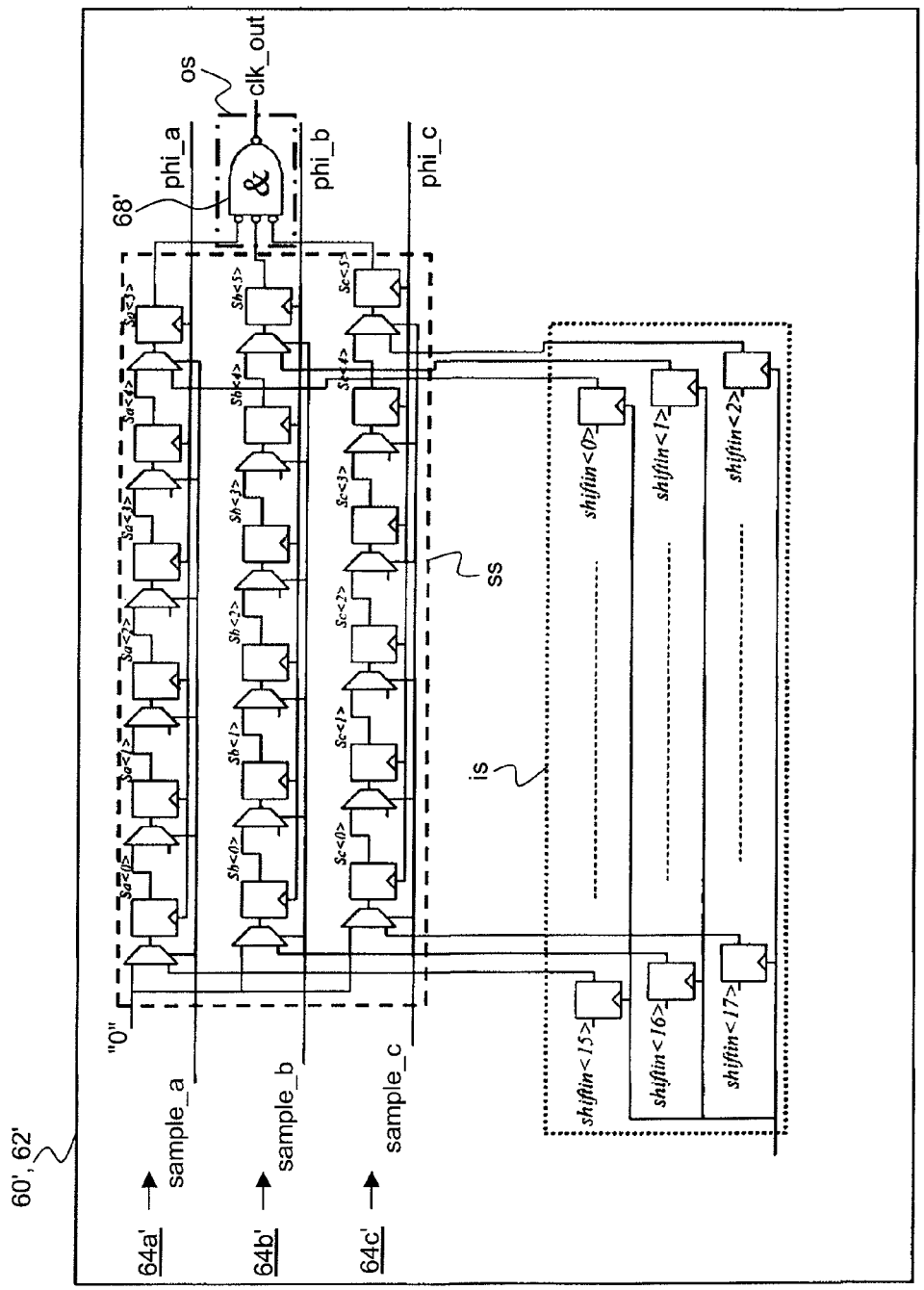
Figure 16:
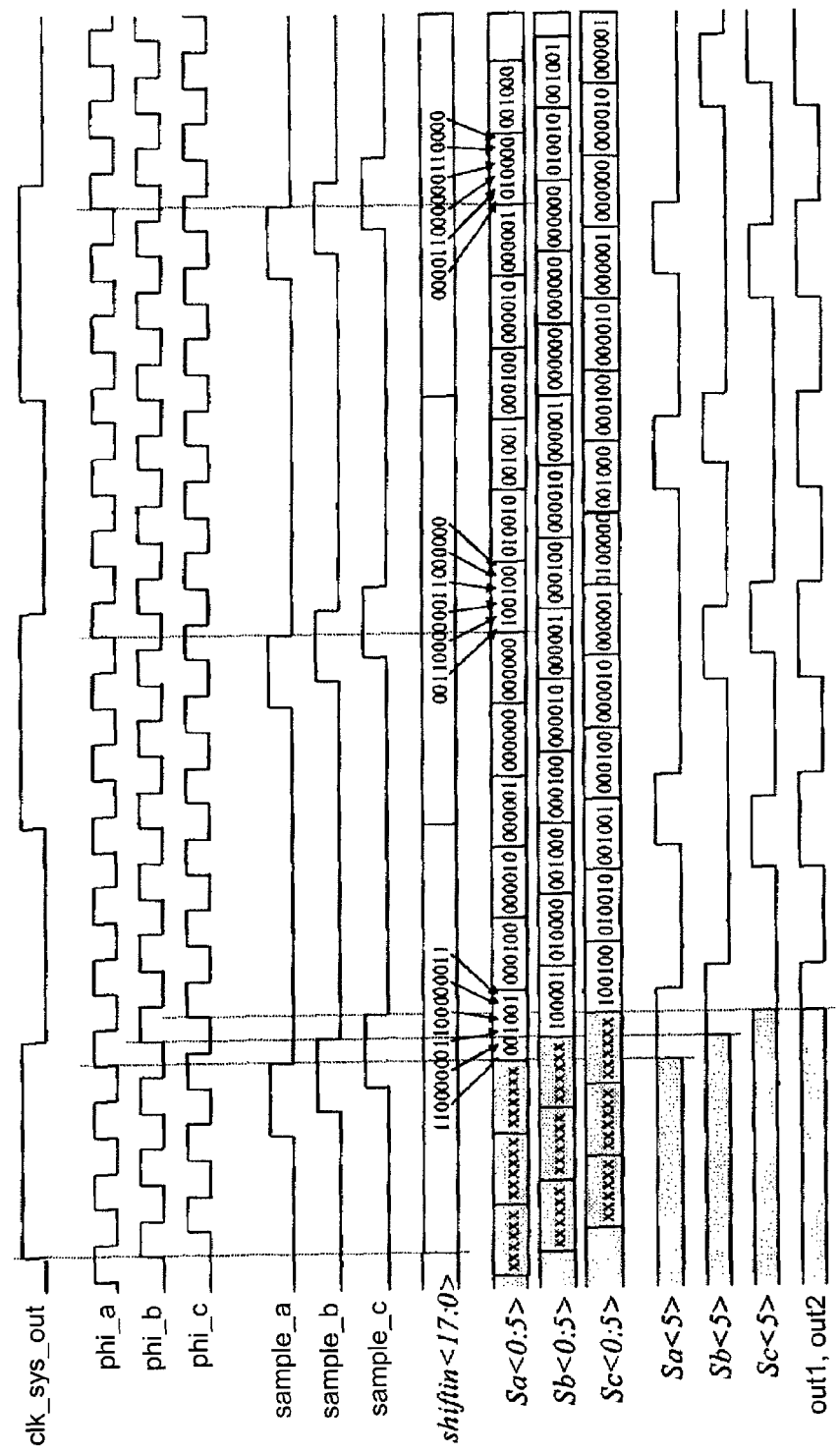
Figure 17:
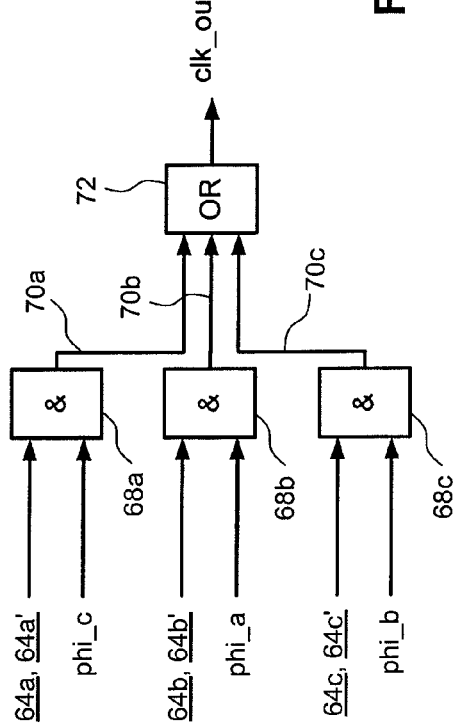
Figure 18:
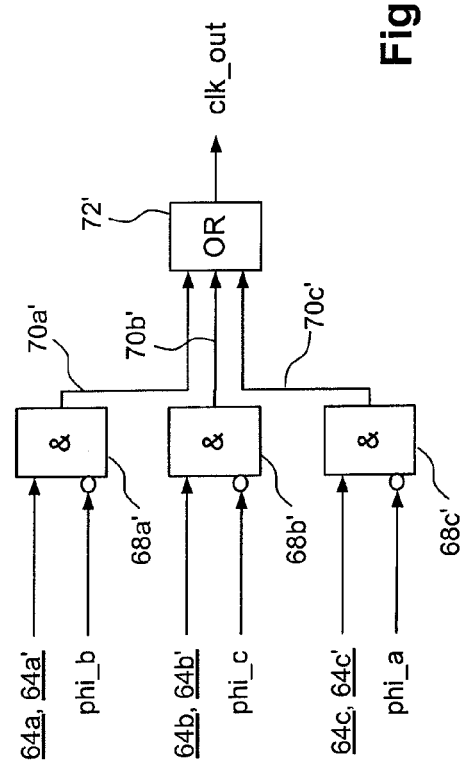
Figure 19:
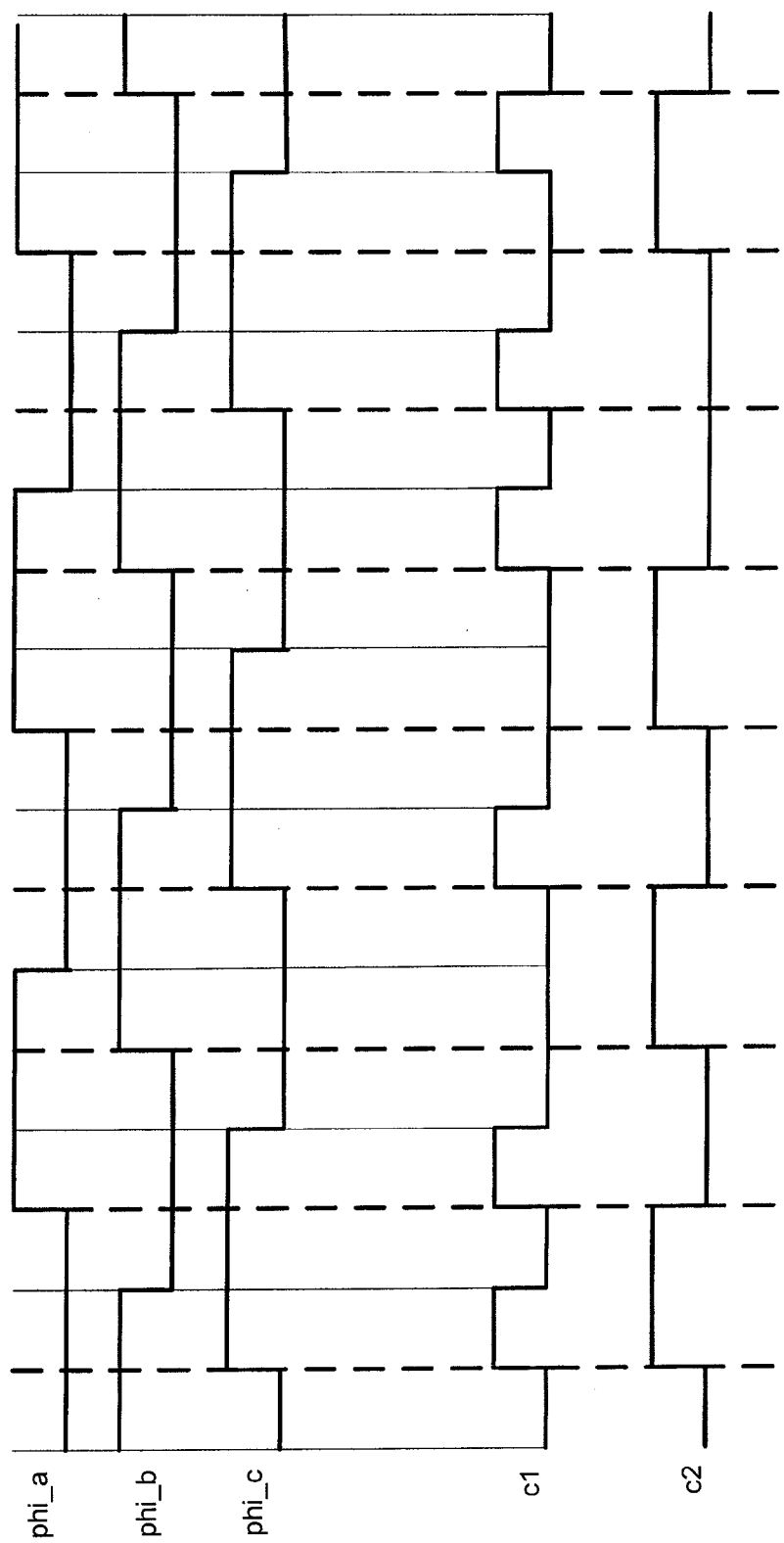
Figure 20:
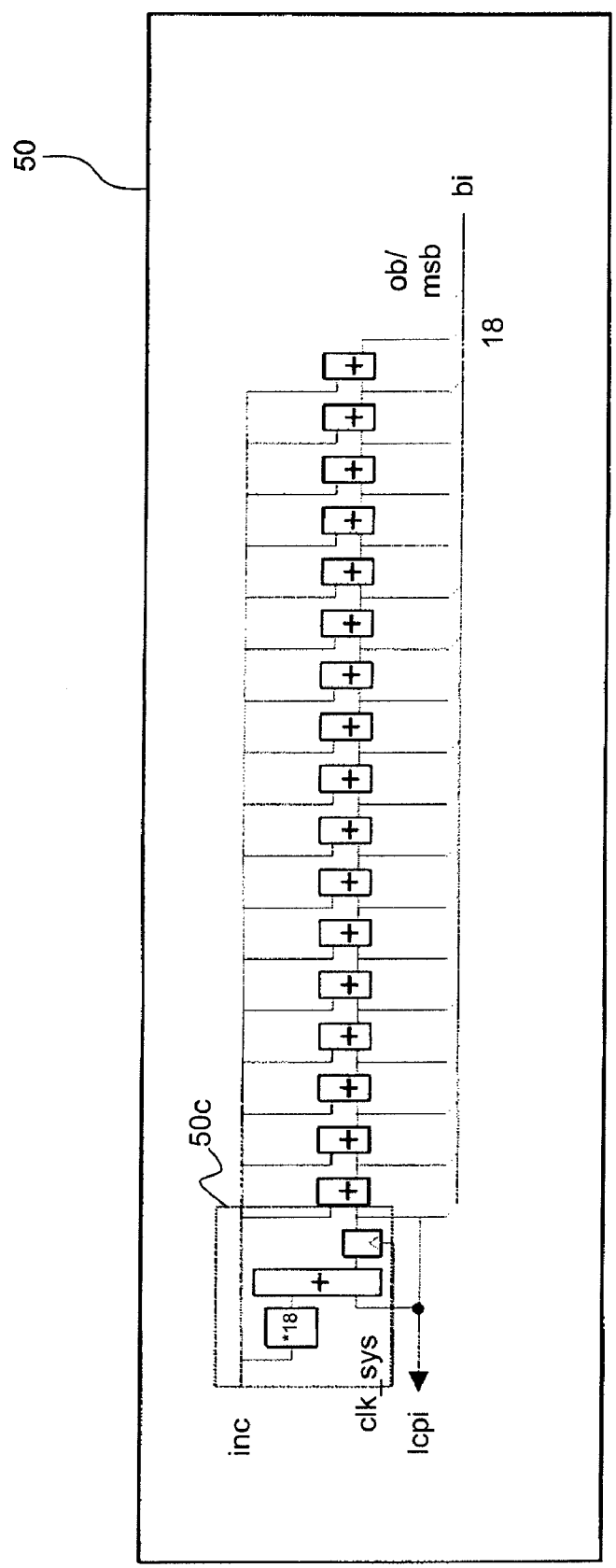
Figure 21:
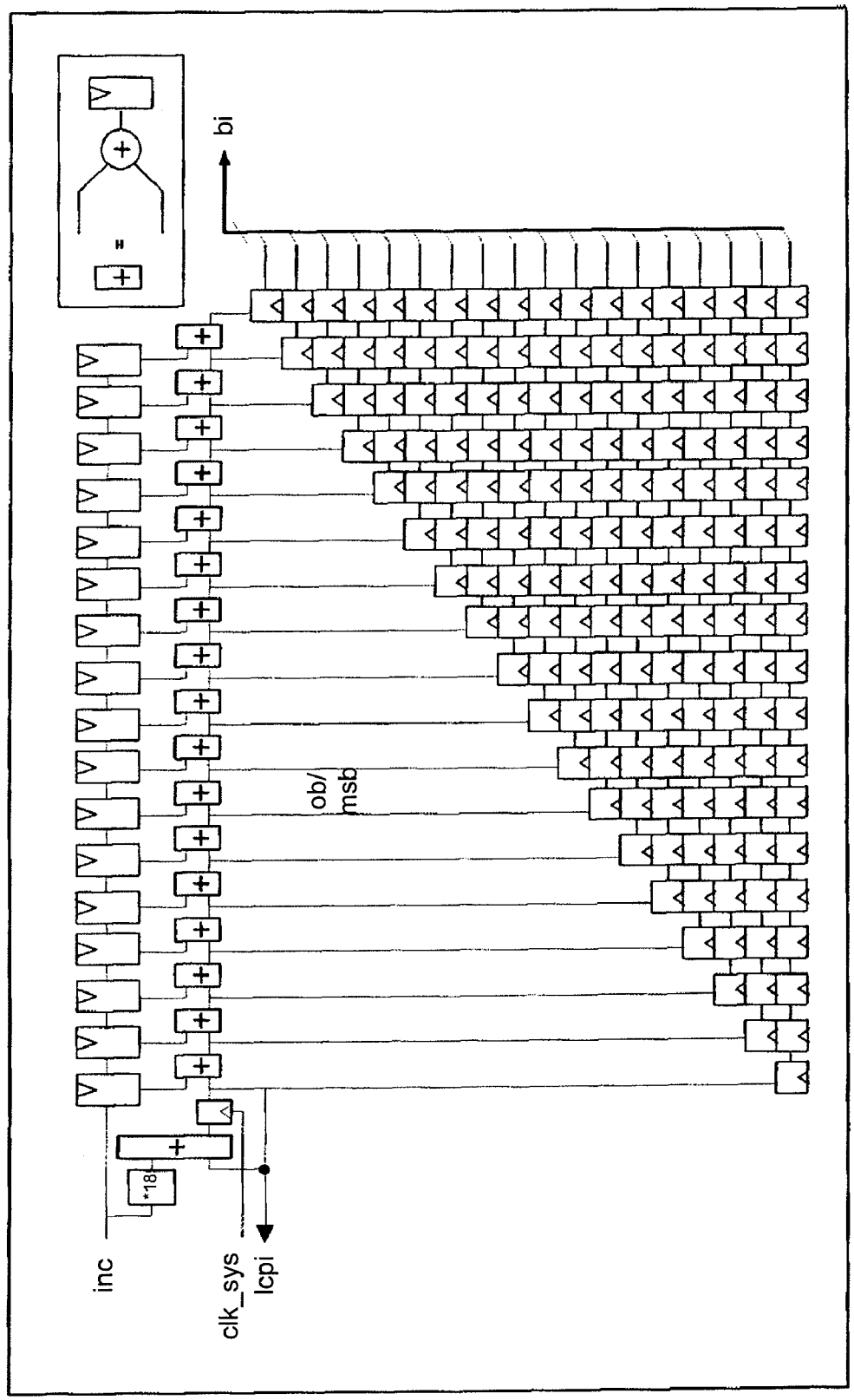
Figure 22:
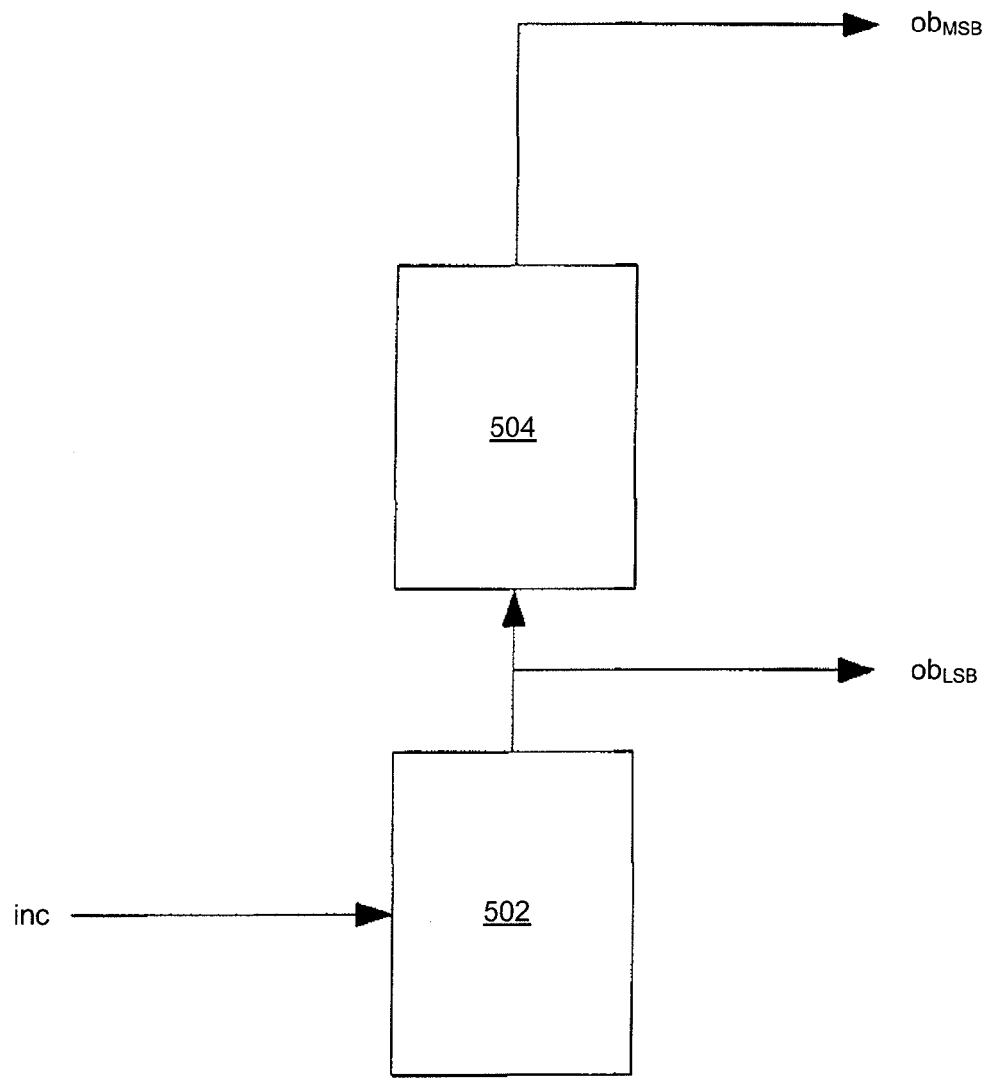

In particular, the present invention finally relates to the use of at least one circuit arrangement as described above and/or of the method as described above for sub-clock and/or sub-pixel accurate phase measurement and phase generation, in particular for digital clock synthesis and/or for completely digital generation of reference signals, like line sync(ronisation) signals for the display part of at least one digital video processor unit As already discussed above, there are several options to embody as well as to improve the teaching of the present invention in an advantageous manner. To this aim, reference is made to the claims respectively dependent on claim 1 and on claim 8; further improvements, features and advantages of the present invention are explained below in more detail with reference to preferred embodiments by way of example and to the accompanying drawings where FIG. 1 schematically shows an embodiment of a digital phase-locked loop structure according to the present invention being operated according to the method of the present invention;

FIG. 2 schematically shows a first embodiment of a loop filter unit being comprised in the digital phase-locked loop structure of FIG. 1, said loop filter unit comprising a P[roportional] control;

FIG. 3 schematically shows a second embodiment of a loop filter unit being comprised in the digital phase-locked loop structure of FIG. 1, said loop filter unit comprising a P[roportional]I[ntegral] control;

FIG. 4 schematically shows a first embodiment of a digital ramp oscillator unit or discrete time oscillator unit being comprised in the digital phase-locked loop structure of FIG. 1;

FIG. 5 schematically shows the functional DTO principle of the digital ramp oscillator unit or discrete time oscillator unit of FIG. 4 in a two-dimensional graphic representation (=characteristics, in particular increasing, of the register unit of the discrete time oscillator unit as a function of time t);

FIG. 6 schematically shows a second embodiment of a digital ramp oscillator unit or discrete time oscillator unit being comprised in the digital phase-locked loop structure of FIG. 1;

FIG. 7 schematically shows the functional DTO principle of the digital ramp oscillator unit or discrete time oscillator unit of FIG. 6 in a two-dimensional graphic representation (=characteristics, in particular increasing, of the register unit of the discrete time oscillator unit as a function of time t);

FIG. 8 schematically shows a first embodiment of a time-to-digital converter unit being comprised in the digital phase-locked loop structure of FIG. 1;

FIG. 9 schematically shows the functional principle of the time-to-digital converter unit of FIG. 8 in a two-dimensional graphic representation (=timing diagram as a function of time t);

FIG. 10 schematically shows a second embodiment of a time-to-digital converter unit being comprised in the digital phase-locked loop structure of FIG. 1;

FIG. 11 schematically shows the functional principle of the time-to-digital converter unit of FIG. 10 in a two-dimensional graphic representation (=timing diagram as a function of time t);

FIG. 12 schematically shows the functional principle of the generation of sample signals in the time-to-digital converter unit of FIG. 10 in a two-dimensional graphic representation (=timing diagram as a function of time t);

FIG. 13 schematically shows a first embodiment of a digital-to-time converter unit being comprised in the digital phase-locked loop structure of FIG. 1;

FIG. 14 schematically shows the functional principle of the digital-to-time converter unit of FIG. 13 in a two-dimensional graphic representation (=timing diagram as a function of time t);

FIG. 15 schematically shows a second embodiment of a digital-to-time converter unit being comprised in the digital phase-locked loop structure of FIG. 1;

FIG. 16 schematically shows the functional principle of the digital-to-time converter unit of FIG. 15 in a two-dimensional graphic representation (=timing diagram as a function of time t);

FIG. 17 schematically shows a first embodiment of an output part of a digital-to-time converter unit being comprised in the digital phase-locked loop structure of FIG. 1;

FIG. 18 schematically shows a second embodiment of an output part of a digital-to-time converter unit being comprised in the digital phase-locked loop structure of FIG. 1;

FIG. 19 schematically shows the functional principle of the digital-to-time converter unit of FIGS. 17, 18 in a two-dimensional graphic representation (=timing diagram as a function of time t);

FIG. 20 schematically shows a first embodiment of an oscilloscope digital ramp oscillator unit or oscilloscope discrete time oscillator unit being comprised in the digital phase-locked loop structure of FIG. 1;

FIG. 21 schematically shows a second embodiment of an oscilloscope digital ramp oscillator unit or oscilloscope discrete time oscillator unit being comprised in the digital phase-locked loop structure of FIG. 1; and FIG. 22 schematically shows a third embodiment of part of an oscilloscope digital ramp oscillator unit or oscilloscope discrete time oscillator unit being comprised in the digital phase-locked loop structure of FIG. 1.

The same reference numerals are used for corresponding parts in FIG. 1 to FIG. 22.

By FIGS. 1 to 22, a new kind of sub-clock or sub-pixel accurate phase-measurement and phase-generation circuit 100 is disclosed. This circuit arrangement 100 can be used for digital clock synthesis and/or for completely digital generation of reference signals like line sync[ronisation] signals for the display part of a digital video processor. The method or principle assigned to this circuit 100 can be used in every application where clocks or reference signals are derived from the frequency or from the phase from an input signal ha.

In order to avoid unnecessary repetitions, the following description regarding the embodiments, characteristics and advantages of the present invention relates (unless stated otherwise)

- to the embodiment of the phase-measurement and phase-generation circuit arrangement 100 according to the present invention (cf. FIG. 1) as well as
- to all embodiments
    of the time-to-digital converter 20 (cf. FIGS. 8, 9: first embodiment without sample-and-hold stages) or 20' (cf. FIGS. 10, 11, 12: second embodiment with sample-and-hold stage ss),
    of the filter 40 (cf. FIG. 2: first embodiment with P[roportional] control) or 40' (cf. FIG. 3: second embodiment with P[roportional]I[ntegral] control),
    of the digital ramp oscillator or discrete time oscillator 50 (cf. FIGS. 4, 5: first embodiment without control of flyback value or maximum content or maximum value dto_max; cf. also FIG. 20: embodiment without pipelining and without splitting of adder units; FIG. 21: embodiment with pipelining but without splitting of adder units; FIG. 22: embodiment without pipelining but with splitting of adder units 502, 504) or 50' (cf. FIGS. 6, 7: second embodiment with control of flyback value or maximum content or maximum value dto_max), and/or of the digital-to-time converter 60, 62 (cf. FIGS. 13, 14: first embodiment without sample-and-hold stages) or 60', 62' (cf. FIGS. 15, 16: second embodiment with sample-and-hold stage ss), all embodiments being operated according to the method of the present invention.

The general digital P[hase-]L[ocked]L[oop] structure of the digital phase-locked loop 100 can be seen from FIG. 1 where a phase detector 30, a loop filter F(s) (<--> reference numeral 40 or 40') and a digital ramp oscillator or discrete time oscillator 50 or 50' are provided as elements of the digital PLL 100.

The discrete time oscillator 50 is an accumulator as depicted in the first embodiment of FIG. 4. By means of an adder 52, the increment inc of the discrete time oscillator 50 is added to the content dto_reg of the DTO register 54. So the dto_status of the discrete time oscillator 50 is the integrated increment inc of the discrete time oscillator 50; the output dto_status is a ramp signal as can be taken from FIG. 5 where the DTO principle of this first embodiment of the discrete time oscillator 50 is illustrated:

Only samples of an equivalent analogue ramp oscillator are available. If these would be interpolated the result would be an ideal ramp signal. The signal dto_co is the carry out signal of the discrete time oscillator 50; it gets one for one clock cycle if an overflow of the register 54 happened.

A second embodiment of the digital ramp oscillator or discrete time oscillator 50' is shown in FIG. 6. By means of an adder 52', the increment inc of the discrete time oscillator 50' is added to the content dto_reg of the DTO register 54'. So the dto_status of the discrete time oscillator 50' is the integrated increment inc of the discrete time oscillator 50'; the output dto_status is a ramp signal as can be taken from FIG. 7 where the DTO principle of this second embodiment of the discrete time oscillator 50' is illustrated.

As an alternative to changing the increment inc (cf. first embodiment of the discrete time oscillator 50 in FIGS. 4, 5), in this second embodiment the discrete time oscillator 50' can also be tuned by changing the flyback amplitude; this is used for example in a DOP deflection processor.

For this purpose, the maximum content or maximum value or flyback value dto_max of the DTO 50' is controlled (leading to the effect that the phase calculation becomes more complex). The increment inc is a fixed value and can be taken from a controlling register. The first implementation i1 (cf. FIGS. 6, 7) of the second embodiment of the discrete time oscillator 50' checks the relation between the maximum value dto_max of the discrete time oscillator 50' and the status value dto_status of the discrete time oscillator 50' by using a comparator 56'.

In case the status value dto_status is larger than the maximum value dto_max, this maximum value dto_max is subtracted from the status value dto_status by using a subtractor 58'; this subtraction results in the timing diagram of FIG. 7.

In case of the first implementation i1 (cf. FIGS. 6, 7) of the second embodiment of the discrete time oscillator 50', the triangle is able to vary between 0 and dto_max+inc; in case of the second implementation i2 (cf. FIGS. 6, 7) of the second embodiment of the discrete time oscillator 50', the triangle occupies the interval between −inc and dto_max.

By way of the status signal dto_status (indicating the status value of the register 54, 54' with a certain word length), the phase detector 30 in FIG. 1 samples the status value of the discrete time oscillator 50 or 50' after the reference edge of the input signal ha (so-called edge detection).

The output delta_phi of the phase detector 30 is the phase difference between the input signal of the PLL 100 and the output signal of the PLL 100. This phase difference delta_phi is applied into the filter unit 40 or 40' which can be—depending on the application area—any kind of filter, for example a P[roportional] filter 40 (cf. FIG. 2), a P[roportional plus]I[ntegral] filter 40' (cf. FIG. 3), a P[roportional plus]I[ntegral plus]D[erivative] filter or the like.

In case the loop is made with a simple filter 40 only doing p[roportional] gain (cf. FIG. 2) and with phase error then not settling to zero, such p[roportional]-only loop filter 40 may be regarded as being not an explicit part of the design of the circuit arrangement 100.

In more detail, the schematic diagram of FIG. 2 shows the loop filter 40 with such P[roportional] control; in particular, said loop filter unit 40 of FIG. 2 comprises a proportional element 42 for multiplying the output signal delta_phi of the phase detector 30 by a proportional coefficient or proportional factor Kp.

In the schematic diagram of FIG. 3, the loop filter 40' is depicted in modified way, namely with P[roportional]I[ntegral] control wherein account is taken of the fact that a P[roportional]I[ntegral] controller represents an optimum in terms of its control mode:

If P[roportional] controller and I[ntegral] controller are combined, the result is a controller which on account of its P[roportional] part can react quickly to changes in the control variables and which can continuously change its manipulated variable on account of the I[ntegral] part and also on account of the P[roportional] part. P[roportional]I[ntegral] controllers may be designed such that the control deviation is very small or even disappears; however, the control deviation is not automatically zero.

As shown in the diagram in FIG. 3, the loop filter 40' has a proportional element 42' for multiplying the output signal delta_phi of the phase detector 30 by a proportional coefficient or proportional factor Kp. Before said proportional element 42', the path within loop filter 40' branches off, namely into a proportional path 40p' (the upper path in FIG. 3), and into an integral path 40i' (the lower path in FIG. 3).

The integral path 40i' comprises an integral element 44' for multiplying the output signal delta_phi of the phase detector 30 by an integral coefficient or integral factor Ki.

The arrangement of the proportional element 42' and the integral element 44' as shown in FIG. 3 is designed such that the loop filter 40' meets the set requirements, namely of being able to separately adjust the damping factor and the decay time constant.

In order to integrate the output signal 44o' of the integral element 44', an integrator is provided which is composed of the components 46', 48b' and more specifically comprises a second adder 48b' for adding the output signal 44o' of the integral element 44' to the fed-back output signal 46o' of the integrator 46', 48b'. In this context, the integrator 46', 48b' is essentially formed by a fed-back delay element 46' (-->symbol $z^{-1}$).

Unlike the procedure according to prior art document U.S. Pat. No. 6,320,574 B1, in the present invention it is advantageous to have the proportional path 40p' and the integral path 40i' arranged separately; otherwise(cf. prior art document U.S. Pat. No. 6,320,574 B1), the coupling or lock-on characteristic varies as a function of the respective direction with which the coupling or lock-on takes place, wherein this direction may be given by frequencies higher than the reference frequency or by frequencies lower than the reference frequency.

As can be further taken from the schematic diagram of FIG. 3, the output signal 42o' of the proportional path 40p' and the output signal 46o' of the integral path 40i' are added in a first adder 48a' connected downstream of these two paths 40p', 40i', the addition of these two output signals 42o', 46o' resulting in the increment signal inc.

T[ele]V[ision] applications as mentioned in the above chapter "Background and prior art" often make use of a PI control characteristic (=proportional plus integral); this results in a second order P[hase-]L[ocked]L[oop].

In other cases (F[requency-]L[ocked]L[oops]), there may only be a frequency control circuit for the increment inc; this can be freely defined.

The output of the loop filter 40 or 40' is the increment inc controlling the frequency $f_{DTO}$ of the discrete time oscillator 50 (cf. FIG. 4) according to the equation $f_{DTO}=f_{xtal}\cdot inc/dto\_max$. So any rational ratio between the increment inc and the maximum content or maximum value dto_max of the discrete time oscillator 50 (cf. FIG. 4) can be realized.

For the purpose of controlling, the steepness of the DTO 50 or 50' is important. In the first embodiment (cf. FIGS. 4, 5) of the discrete time oscillator 50, the steepness is $\partial f_{DTO}/\partial inc=f_{xtal}/dto\_max$; in both implementations i1, i2 (cf. FIGS. 6, 7) of the second embodiment of the discrete time oscillator 50', the steepness is $\partial f_{DTO}/\partial dto\_max=f_{xtal}\cdot inc/dto\_max^2$.

Thus, the ratio of frequency resolution between the second embodiment of the discrete time oscillator 50' (cf. FIGS. 6, 7) is dto_max/inc compared to the first embodiment of the discrete time oscillator 50 (cf. FIGS. 4, 5). Consequently, the second embodiment of the discrete time oscillator 50' (cf. FIGS. 6, 7) results in a larger resolution if inc<dto_max. This is true for the described implementations i1, i2.

According to known solutions, the accuracy of the output clock is limited, as its rising edges and falling edges can only coincide with rising edges of the system clock. For enhancing the resolution to subclock or subpixel accuracy the digital phase-locked loop 100 comprises a time-to-digital converter 20 (cf. FIGS. 8, 9: first embodiment without sample-and-hold stages), 20' (cf. FIGS. 10, 11, 12: second embodiment with sample-and-hold stage ss) for improving the phase measurement.

For each output signal with different output frequencies or with different output phases an additional digital-to-time converter 60, 62 (cf. FIGS. 13, 14: first embodiment without sample-and-hold stages), 60', 62' (cf. FIGS. 15, 16: second embodiment with sample-and-hold stage ss) is implemented.

Each digital-to-time converter 60, 62 or 60', 62' delivers an output signal ho1, ho2 the phase of which is locked to the input signal ha of the phase-locked loop 100. If the input signals dto_co of the digital-to-time converters 60, 62 or 60', 62' are derived from the same discrete time oscillator 50 or 50' these output signals ho1, ho2 have a fixed phase relation.

The time-to-digital converter 20 or 20' and the digital-to-time converters 60, 62 or 60', 62' are quite different from those known in the prior art insofar as the time-to-digital converter 20 or 20' and the digital-to-time converters 60, 62 or 60', 62' according to the present invention do not make use of any analog delay line.

For the implementation of the digital-to-time converters 60, 62 or 60', 62' the discrete time oscillator 50 or 50' is expanded to a so-called oscilloscope DTO (cf. detailed explanation below with respect to FIGS. 20, 21).

The principle of the time-to-digital converter 20 in the project U[ltimate]O[ne]C[hip]-[TV]5 is shown in FIG. 8. In this case, there are three clock phases phi_a, phi_b, phi_c out of the clock multiplier phase-locked loop applied to three shift registers 22a, 22b, 22c. In this context, the input of the clock multiplier is preferably provided by a stable reference clock signal, for example from a crystal oscillator.

There can be any other number of clock phases, for example six or $2^n$; this would change the timing relations and the resolution, but not the principle.

In the case of FIG. 8, i. e. in the case of three clock phases phi_a, phi_b, phi_c, there is a skew of 120 degrees between the clock phases phi_a-phi_b, clock phi_b-phi_c and clock phi_c-phi_a. The input signal ha is applied to the input of each shift register 22a, 22b, 22c. The first three latch units of each shift register 22a, 22b, 22c are implemented as F[lip]F[lop]s in order to avoid meta-stability; this could also be two latch units, in particular two F[lip]F[lop]s, or more than three F[lip]F[lop]s, in particular more than three F[lip]F[lop]s.

Independently of the actual number of latch units, in particular of F[lip]F[lop]s, it has to be seen that the most sensitive part of the design of the time-to-digital converter 20 are the first F[lip]F[lop]s in each chain 22a, 22b, 22c. These first F[lip]F[lop]s have to be placed and layouted very carefully, i. e. in a very accurate design (<-->reference numeral vad) in order to avoid significant contribution to the perceived jitter.

The actual phase measurement is done with the next six latch units of each shift register 22a, 22b, 22c each of these six latch units being embodied as F[lip]F[lop] corresponding to a stage s1, s2, s3, s4, s5, s6, i. e.
the fourth F[lip]F[lop] corresponding to the first stage s1,
the fifth F[lip]F[lop] corresponding to the second stage s2,
the sixth F[lip]F[lop] corresponding to the third stage s3,
the seventh F[lip]F[lop] corresponding to the fourth stage s4,
the eighth F[lip]F[lop] corresponding to the fifth stage s5, and
the ninth F[lip]F[lop] corresponding to the sixth stage s6.

The choice of six F[lip]F[lop] s is related to the frequency ratio of the clock phases phi_a/phi_b/phi_c and the system clock clk_sys of the phase-locked loop 100, which is six in UOC-5 but can be any number in the general case.

In order to have a relaxed timing in the circuit arrangement 100, the output of the first shift register chain 22a is resampled with the third clock phase phi_c. The output of this register 22a together with the phases of the other shift register chains 22b, 22c give correctly ordered the distance of the edge of the input signal ha to the next edge of the system clock clk_sys of the phase-locked loop 100 (in this case, the second clock phase clock phase phi_b divided by six) in thermometer notation.

In order to get this code in three shift register chains 22a, 22b, 22c synchronous to the clk_sys domain it is resampled by the first clock phase phi_a in a second resample stage rs2 and by the third clock phase phi_c again in a third resample stage rs3. This is done with relaxed timing wherein the setup time of the F[lip]F[lop] s can be two-thirds instead of one-third of phi_a period/phi_b period/phi_c period, for example for a phi_a-->phi_b transition.

In this case, the system clock clk_sys of the phase-locked loop 100 is generated by dividing the second clock phase phi_b by six and a deep clock tree both causing skew and phase uncertainty. In order to get rid of this as well as in order to improve the timing of the circuit, the three resample stages rs1, rs2, rs3 have been implemented. If there is neither skew nor uncertainty, these three resample stages rs1, rs2, rs3 can be omitted.

At the output of the time-to-digital converter 20 a decoder 24 being embodied as tally decoder is provided for converting the thermometer code to a binary number; this can be done by the means of a look-up table because only a certain number of events have to be taken into consideration:

If a rising edge of the input signal ha happens shortly before the edge of the first clock phase phi_a the first F[lip]F[lop] of the first shift register chain 22a samples a "1" if the setup time is not violated at the first F[lip]F[lop]. Then the first F[lip]F[lop] of the second shift register chain 22b samples a "1", then the first F[lip]F[lop] of the third shift register chain 22c. With every rising edge of each clock phase phi_a, phi_b, phi_c, the "1" reaches the next F[lip]F[lop] of its chain 22a, 22b, 22c.

If the phases are ordered c6, b6, a6, c5, b5, a5, . . . for example in the first resembling register with the second clock phase phi_b (cf. FIG. 8) then the output of the three shift register chains 22a, 22b, 22c is thermometer code or tally code:

| first stage s1 abc | second stage s2 abc | third stage s3 abc | fourth stage s4 abc | fifth stage s5 abc | sixth stage s6 abc |
|---|---|---|---|---|---|
| 000 | 000 | 000 | 000 | 000 | 000 |
| 100 | 000 | 000 | 000 | 000 | 000 |
| X10 | 000 | 000 | 000 | 000 | 000 |
| XX1 | 000 | 000 | 000 | 000 | 000 |
| XXX | 100 | 000 | 000 | 000 | 000 |
| XXX | X10 | 000 | 000 | 000 | 000 |
| XXX | XX1 | 000 | 000 | 000 | 000 |
| . . . | | | | | |
| XXX | XXX | XXX | XXX | XXX | XXX |

If the input signal ha is longer than a pulse of the system clock clk_sys all "X" are "1" and so the code is a real thermometer code. If the pulse of the system clock clk_sys is shorter and has any length this principle can also be used because only the leading "1" are of interest.

In principle every other phase can be taken as reference for the system clock clk_sys; this saves one resampling stage (<--> clock phase phi_c) or two resampling stages (<--> clock phase phi_a). Also, the order is not important; any order of the bits gives a unique phase word.

In FIG. 8, tally code is used (<--> tally decoder 24) because tally code is easier to interpret. However, alternatives to the tally decoder unit 24 exist because it is about numerical representation used as input for the phase detector 30. In general, there can be any order of bits and number representation ("0" can be exchanged by "1" and vice versa) to maintain the principle.

For illustration, an example can be found in the timing diagram of the time-to-digital converter 20 as shown in FIG. 9:

If a rising edge of the input signal ha happens shortly before a rising edge of the first clock phase phi_a and this is the first edge where the setup-time and hold-time of the F[lip]F[lop] is not violated the first F[lip]F[lop] in the first shift register chain 22a samples the signal first. This will ripple through the next F[lip]F[lop] and enter the first F[lip]F[lop] of the first shift register chain 22a in the first stage s1. As next F[lip]F[lop] in the first stage s1 the F[lip]F[lop] triggered with the second clock phase phi_b samples the signal and so on.

In other words, "1"s ripple through all three shift register chains 22a, 22b, 22c. It depends on the distance between the rising edge of the input signal ha and the next rising edge re of the system clock clk_sys how many "1"s can be found in the three shift register chains 22a, 22b, 22c at the sampling point sp.

Furthermore the timing between the second clock phase phi_b in this case and the system clock clk_sys also has to be taken into consideration to find out whether the edge of the second clock phase phi_b generating the system clock clk_sys also contributes a "1" or not.

With the tally decoder unit 24 the tally code is converted into a binary number. Here already the number of stages can be taken into consideration if the number of stages is not $2^n$. Then for example in a look-up table for the output signal tdc_out of the time-to-digital converter 20 the calculation tdc_out=$2^n$·number_ones/number_of_stages can be done.

In general, the accuracy is determined by the number of subphases and by the clock frequency. If the number of output bits is sufficient to code all possible subphases, an additional rounding error will not occur. However, there can be a rounding error; in general, rounding is introduced in rescaling the output signal tdc_out of the time-to-digital converter 20 to the system-resolution; an appropriate countermeasure is to implement the word with enough bits to improve the virtual resolution. Thus, the effect of such rounding error can be reduced
  by a sufficient number n of bits for the output signal tdc_out of the time-to-digital converter 20 and/or
  by a design of the time-to-digital converter 20 with $2^n$ number of stages.

Before this value can be used for correcting the phase word (being traceable back in FIG. 1 to the output delta_phi of the phase detector 30) the output tdc_out of the time-to-digital converter 20 can be converted into a useful representation for the phase detector 30 and can then be filtered by the loop filter 40 or 40' in order to derive the increment value inc for the discrete time oscillator 50 or 50'.

Preferably, the output tdc_out of the time-to-digital converter 20 has to be rescaled to the increment inc of the digital ramp oscillator or discrete time oscillator 50 or 50', i. e. according to the given formula. This value is used to interpolate between two clock-cycles.

For doing this it has to be taken into consideration whether this module measures the phase of the input signal ha
  with respect to the edge of the next clock cycle (=early value) or
  with respect to the edge of the last clock cycle (=late value).
  The rescaled value is then
  subtracted (early value) from or
  added (late value) to the status (reference numeral dto_status) of the discrete time oscillator 50 or 50'.

Rescaling of the output value tdc_out of the time-to-digital converter 20 can be done according to the formula phi_subpixel=inc·tdc_out/$2^n$; in this context, the n in the term $2^n$ corresponds to the width of phi_subpixel.

The so-called hand layout domain being defined in FIG. 8 by all components of the time-to-digital converter 20 apart from the tally decoder 24 and the rising edge detector 26 needs to be layouted very accurately with respect to matching of delays and of loads.

The rising edge detector 26 of the time-to-digital converter 20 is an exemplifying embodiment for a unit finding a line/h[orizontal]sync[hronisation] event and can be implemented in several manners. One example is by a conventional rising edge detector. A second option, i. e. a different implementation of the rising edge detector 26 is to decode it out of the tally code of the tally decoder 24: if the output of the tally code or tally decoder 24 changes from zero to something else this can also be used for edge detection; in this case a direct rising edge detector 26 is less area-consuming.

The most sensitive parts are the first F[lip]F[lop]s in the input stage of each shift register 22a, 22b, 22c as marked in FIG. 8 as very accurate design (reference numeral vad). If the layout is asymmetrical this will increase the perceived jitter.

An alternative implementation of the time-to-digital converter 20' with sample-and-hold stages in the project U[lti-mate]O[ne]C[hip]-[TV]5 is shown in FIG. 10.

Also in this case three clock phases out of the clock multiplier phase-locked loop are applied to the time-to-digital converter 20'; there can be any other number of clock phases dividing the period of the system clock clk_sys into sub-clock intervals, for example six or $_2$'.

Increasing the number of phases relaxes the timing of the time-to-digital converter 20' but can add jitter due to timing offsets between the phases; the principle does not change. Also in this case there is a skew of 120 degrees between the clock phases phi_a-phi_b, clock phi_b-phi_c and clock phi_c-phi_a.

The time-to-digital converter 20' comprises four stages:
an input stage is,
a shift stage ss,
a sample-and-hold stage shs, and
an output stage os:

The input stage is contains three shift registers being part of respective shift register chains 22a', 22b', 22c' running on the first clock phase phi_a, on the second clock phase phi_b and on the third clock phase phi_c. It is added to avoid metastability. The input shift registers can also have a length of two latch units, in particular of two F[lip]F[lop] s, or of more than three latch units, in particular of more than three F[lip]F[lop] s.

The phase measurement is done in the shift stage ss. This shift stage ss contains the second part of the three shift register chains 22a', 22b', 22c', each with a length of six latch units, in particular of six F[lip]F[lop]s, running on the first clock phase phi_a, on the second clock phase phi_b and on the third clock phase phi_c.

If a rising edge of the input signal ha of the time-to-digital converter 20' happens shortly before the edge of the third clock phase phi_c, the first F[lip]F[lop] of the third shift register chain 22c', the register clocked by the third clock phase phi_c, samples a "1" if the setup timing requirements are not violated at the first F[lip]F[lop].

Then the first F[lip]F[lop] of the first shift register chain 22a' samples a "1" and then the first F[lip]F[lop] of the second shift register chain 22b' samples a "1". With every rising edge of each clock phase the "1" reaches the next F[lip]F[lop] in its chain 22a', 22b', 22c'.

After a rising edge of the system clock output signal clk_sys_out, the sample signals sample_a/sample_b/sample_c are high for a period of the clock phases phi_a/phi_b/phi_c (cf. FIG. 12 with regard to the generation of the sample signals sample_a/sample_b/sample_c) and the content of the shift register chains 22a', 22b', 22c' is copied to the sample-and-hold stage shs. The sample-and-hold stage shs guarantees a save crossing between all clock domains. The output of this sample-and-hold stage shs stays constant for one period of the system clock output signal clk_sys_out.

The output stage os can now safely copy the data from the sample-and-hold stage shs with the next rising edge of the system clock output signal clk_sys_out.

The eighteen-bit value of the output stage os represents the distance of the edge of the input signal ha to the next edge of the system clock output signal clk_sys_out (the second clock phase phi_b in this case divided by six by means of the divider unit div) in thermometer notation. The thermometer notation can be used because it is easy to interpret but any other notation, for instance other bit orders, can also be used. It is important that the output values are unique.

FIG. 11 shows a timing diagram of the time-to-digital converter 20' with the sample and hold stage shs. At the output of the time-to-digital converter 20' a tally decoder is provided (not shown in FIG. 10 for reasons of clarity) converting the thermometer code into a binary number. This can be done
by a look-up table because only a certain number of events has to be taken into consideration, or
by an adder counting the number of "1"s or "0"s in the thermometer code.

The operation of the digital-to-time converter 60, 62 is explained by FIG. 13 in the hand layout domain. The digital-to-time converter 60, 62 also comprises three shift registers 64a, 64b, 64c, one for each clock phase phi_a, phi_b, phi_c.

The first two F[lip]F[lop]s (with regard to clock phase phi_a) or three F[lip]F[lop]s in each shift register chain 64a, 64b, 64c are triggered by different clock domains in order to transfer the phase_word being also applied to the digital-to-time converter 60, 62 from the clock domain clk_sys to the desired phase domain.

The clock phase phi_a/phi_b/phi_c splits the interval of the system clock clk_sys into subintervals (in the exemplary embodiment of FIG. 13 into eighteen subintervals). The number of subintervals depends
on the number of clock cycles or clock phases phi_a, phi_b, phi_c and
on the frequency relation between the system clock clk_sys and the subphases.

Each "1" in the phase-word indicates that the output signal clk_out of the digital-to-time converter 60, 62 in the related time interval is intended to be high and vice versa each "0" in the phase_word indicates that the output signal clk_out of the digital-to-time converter 60, 62 in the related time interval is intended to be low.

In this context, a "1" can dominate a "0" by design. In this case, a "1" is active for one clock period of the clock triggering the register containing the "1". The output can only change if the "1" turns to "0".

The phase_word can be derived for example from a look-up table or from the digital ramp oscillator or discrete time oscillator 50 or 50'; alternatively, the phase_word can also be taken from a memory where a certain pattern is stored or calculated in a completely different manner.

The phase_word is generated for each clock cycle of the system clock clk_sys. The phase_word is loaded at one clock cycle phi_a/phi_b/phi_c into the related shift registers 64a, 64b, 64c.

For this reason, a rising edge detector 66 (being an exemplifying embodiment for a unit finding a line/h[orizontal]sync[hronisation] event) is applied to the system clock clk_sys. The output of the rising edge detector 66 is applied to eighteen AND-gates 68, which make sure that the output is non-"0" for at most one clock cycle phi_b (, i. e. the output can also remain low). The output of the AND-gates 68 is applied to the first register in the shift register chains 64a, 64b, 64c.

As shown in FIG. 13, each register comprises six bits. These are the bits representing one clock phase interval of the related chain 64a, 64b, 64c; together there are eighteen bits.

Resampling is done by the resampling block in FIG. 13
to ensure that the words are available at the line defining the very accurate design area (<--> reference numeral vad in FIG. 13) at the correct sub-clock phase and
to avoid timing violations if it is again assumed that the clock cycles phi_a/phi_b/phi_c have a skew of 120 degrees at a frequency in the range of one Gigahertz.

If here a bit is non-"0", with the next sub-clock edge the F[lip]F[lop]s in the related shift register chain 64a, 64b, 64c are loaded simultaneously because the F[lip]F[lop]s in the chain 64a, 64b, 64c except the first (<--> reference numeral fiFF in FIG. 13) are connected via OR-gates.

If the one input of the OR-gate is "1", the output will also be "1", independent of the other input. So if the loading inputs of the OR-gates return to zero again after the load cycle (which is made sure by the eighteen AND-gates 68) the shift register chains 64a, 64b, 64c return to shift mode again.

In shift mode, the first F[lip]F[lop]s fiFF in each shift register chain 64a, 64b, 64c get a "0", so the shift registers get empty step by step and the "1"s in the register determine the output of the OR-gate combining the output of the three chains 64a, 64b, 64c.

The operation of the digital-to-time converter 60, 62 is illustrated in FIG. 14 by an example for timing in the digital-to-time converter 60, 62. In FIG. 13, the L[east]S[ignificant]B[it] of the phase word controlling the last F[lip]F[lop] in the chain (=FF1 in each chain; reference numeral laFF in FIG. 13) is on the left side, and the M[ost]S[ignificant]B[it] of the phase word is on the right side (continuing the line after a F[lip]F[lop]/latch means the same bit in FIG. 13).

It is assumed that the F[lip]F[lop] with the designation a2 (cf. FIG. 13) generates an output signal. For this F[lip]F[lop] the fourth bit counted from the left bit is responsible. So the input of the digital-to-time converter 60, 62 receives a signal "000000000000100000".

This signal is resampled with the register aa1 (cf. FIG. 14) sampling the input for the first shift register chain 64a and is clocked with the first clock cycle phi_a. Since the skew between the first clock cycle phi_a and the second clock cycle phi_b is 240 degrees this resampling and clocking is to happen after two-thirds of a clock period of the clock cycle phi_a/phi_b/phi_c. This is again resampled with the clock cycle phi_a in the register aa2 (cf. FIG. 14).

After that the content is split up for the different F[lip]F[lop]s in the first shift register chain 64a. With the next active edges of the clock cycle phi_a the "1" of the F[lip]F[lop] a2 (cf. FIG. 14) ripples through the remaining chain until it reaches the last F[lip]F[lop] (<--> reference numeral laFF in FIG. 13). If the output of the F[lip]F[lop] a1 is "1", the output of the output OR-gate also gets "1".

One OR-gate is the minimum number of gates to be implemented between the F[lip]F[lop]s. This determines how fast the whole sub-clock or sub-pixel accurate phase-measurement and phase-generation circuit 100 can be.

Instead of an OR-gate also another gate can be used, for example a NAND-gate. In this case it can be considered to load not with "1"s but with "0"s instead; by this, the present circuit 100 can be made much faster. The maximum clock frequency at the output can be half of the frequency of the clock cycle phi_a/phi_b/phi_c with this configuration.

In principle with this approach it is possible to reach the one and a half of the frequency of the clock cycle phi_a/phi_b/phi_c without violating the Nyquist criterion. This can be achieved if not only the "1"s determine the output but also the "0"s. To do this for example the output gate can be a three-input XOR-gate. The generation of the phase_word also has to take this into consideration.

In this case the achieved frequency is high enough; the clock cycles phi_a/phi_b/phi_c comprise a frequency f of 737.28 Megahertz (corresponding to a time period T=1/f of 1.356 nanoseconds); the system clock clk_sys comprises a frequency of 122.88 Megahertz.

The resolution to be realized is 450 picoseconds, i. e. about a third of 1.35 nanoseconds with three phases. With six phases, 225 picoseconds are possible. The minimum skew the circuit 100 has to be retimed for is 0.9 nanoseconds; from this value some margin has to be subtracted for layout, controlling margin and noise of the P[hase-]L[ocked]L[oop] 100.

The whole area of the digital-to-time converter 60, 62 in FIG. 13 has to be layouted very accurately (<--> very accurate design with reference numeral vad). Any asymmetry in the layout will increase the jitter of the output signal clk_out of the digital-to-time converter 60, 62. The most sensitive part is marked in FIG. 13. The trigger and the outputs of these F[lip]F[lop] s and the OR-gate itself determine the jitter performance of the digital-to-time converter 60, 62.

An alternative implementation of the digital-to-time converter 60', 62' with sample-and-hold stages, in particular with sample-and-hold F[lip]F[lop]s, is shown in FIG. 15.

The digital-to-time converter 60', 62' comprises three stages:
 an input stage is,
 a shift stage ss, and
 an output stage os:

The input stage is takes over the data from the digital ramp oscillator or discrete time oscillator 50 or 50' and keeps the data stable for one period of the system clock output signal clk_sys_out. During this period of the system clock output signal clk_sys_out the data can safely be loaded into the shift stage ss (cf. FIG. 16 schematically showing the functional principle of the digital-to-time converter 60', 62' with sample and hold F[lip]F[lop]s in a two-dimensional graphic representation, namely in the form of a timing diagram).

The shift stage ss contains three shift registers comprised
 in the first shift register chain 64a', clocked by the first clock cycle phi_a,
 in the second shift register chain 64b', clocked by the second clock cycle phi_b, and
 in the third shift register chain 64c', clocked by the third clock cycle phi_c.

The moment the data is transferred is determined by the sample signals sample_a, sample_b, sample_c (cf. FIG. 12). The sample signals sample_a, sample_b, sample_c can be the same sample signals as they are used for the time-to-digital converter 20' with sample-and-hold stages.

When the first sample signal sample_a is high the bits shiftin<15,12,9,6,3,0> are loaded into the shift register of the first shift register chain 64a'; the second sample signal sample_b loads shiftin<16,13,10,7,4,1> into the shift register of the second shift register chain 64b'; the third sample signal sample_c loads shiftin<17,14,11,8,5,2> into the shift register of the third shift register chain 64c'.

With every rising edge of each clock the data reaches the next F[lip]F[lop] in its respective shift register chain 64a', 64b', 64c'. The inputs of the first F[lip]F[lop]s have to be well defined. In the case of FIG. 15, they are connected to a tie-off cell but they can also be derived from a test signal input.

The first F[lip]F[lop] in each shift register chain 64a', 64b', 64c' has got "0" at the data input, the shift registers get empty step by step and the "1" in the register determine the output of the NAND-gate 68' combining the output of the three shift register chains 64a', 64b', 64c'.

In the case of FIG. 15, the output is build by the NAND-gate 68' with inverted inputs; thus, this NAND-gate 68' acts as an OR-gate. The present sub-clock or sub-pixel accurate phase-measurement and phase-generation circuit 100 can also be built of inverted logic so that not "1"s are loaded but "0"s. In this case there is no need for inverting the input of the NAND-gate 68' anymore, and the stages is, ss, os are filled with "1"s instead of "0"s.

The DTO (=digital ramp oscillator or discrete time oscillator 50c in FIG. 20) in the digital P[hase-]L[ocked]L[oop] 100 is extended to a so-called oscilloscope DTO (=oscilloscope digital ramp oscillator or oscilloscope discrete time oscillator 50 in FIG. 20).

The conventional DTO 50c delivers the phase information to the phase detector 30 and can be found in the upper left part of the oscilloscope DTO 50 as depicted in FIG. 20. The right part of the oscilloscope DTO 50 calculates the bit image (<--> reference numeral bi; cf. FIG. 20) of the sub-clock phases with the last dto_status as starting point as input for the digital-to-time converters 60, 62.

This bit image bi represents the level of the output signal related to a virtual clock grid with a clock frequency being in this case three or six times the frequency of the clock cycles phi_a/phi_b/phi_c or eighteen times the frequency of the system clock clk_sys. In general, the frequency of the virtual clock grid is a multiple of the number of stages in the digital-to-time converter 60, 62 and the system clock frequency.

The oscilloscope digital ramp oscillator or oscilloscope discrete time oscillator 50 gets an increment inc from the loop filter 40 or 40' of the digital PLL 100 or an increment from another source in case of a clock synthesizer.

In FIG. 20, the increment inc relates to the frequency level of the virtual clock. So for the conventional DTO 50c the increment inc needs to be multiplied by 18 to have a value fitting to the frequency output level of the DTO 50c.

The conventional DTO 50c and the oscilloscope DTO 50 can be merged if the conventional DTO 50c is the first stage or the last stage of the oscilloscope DTO 50. In the latter case of the conventional DTO 50c being the last stage of the oscilloscope DTO 50, no multiplying of the increment inc is necessary.

The status of the digital ramp oscillator or discrete time oscillator 50 is taken as starting point for the calculation of the bit image bi. To this status the increment inc on virtual clock frequency level is added sequentially:

So the status after the first adder represents the status of the phase one virtual clock cycle after the last active edge of the system clock clk_sys, the status after the second adder represents the status of the phase two virtual clock cycles after the last active edge of the system clock (clk_sys), and so on.

The status after the seventeenth adder represents the status of the phase one virtual clock cycle before the next active edge of the system clock clk_sys. An eighteenth adder gives the same result as the conventional DTO 50c would have with the next system clock cycle.

So there is the freedom to take the output of the conventional DTO 50c as input for the seventeenth adder as it is done in FIG. 20 or to have eighteen adders for the oscilloscope digital ramp oscillator or oscilloscope discrete time oscillator 50. For timing reasons the latter implementation can have benefits.

The overflow bits ob of the oscilloscope adders represent the level of the output on virtual clock grid level at edges of the system clock clk_sys. These overflow bits ob are collected in a register and applied to the digital-to-time converter 60, 62. This is advantageous if the output frequency is very high, for example if the output frequency approximately equals the half frequency of the clock cycles phi_a/phi_b/phi_c.

In this case the duty cycle is anyway about fifty percent plus or minus ten percent. If the duty cycle is not important and if only one subclock interval needs to be zero the nearly double of this frequency can be reached.

If the frequency is significantly lower than instead of the overflow also the most significant bit msb can be taken. In this case the output signal is also about fifty percent. If the overflow bits ob are taken the output pulse comprises a length of one clock cycle phi_a/phi_b/phi_c depending on the shift register generating the output pulse.

In principle only the conventional DTO 50c needs to have the full bit size. The adders for the oscilloscope part of the oscilloscope DTO 50 can have less width, depending on the propagated rounding error and on the jitter requirements at the output.

If the oscilloscope DTO 50 has less bit there is the danger of clocks being forgotten. This is always the case if the conventional DTO 50c and the (virtual) eighteenth stage of the oscilloscope DTO 50 do not have the same content after some latency caused by pipelining (cf. below).

But if a bit width of fifty bits of the DTO 50c is assumed and if the oscilloscope DTO 50 still comprises thirty bits it is hardly possible to get the result within one clock cycle because normal processes do not allow this; so pipelining needs to be introduced; this is depicted in FIG. 21 where the oscilloscope DTO 50c with pipelining is illustrated.

In FIG. 21, every F[lip]F[lop] is clocked with the system clock clk_sys. The increment inc is delayed with a F[lip]F[lop] between each adder. So new increment propagates through the stages while the calculation of the bit images bi with the old F[lip]F[lop]s is still going on in the last stages.

The overflow bits ob and/or the most significant bits msb are collected in F[lip]F[lop]s, which number increases from stage to stage because the number of accomplished overflow bits ob also increases.

It depends on the process whether there has to be a pipelining between each stage. It is also possible that there is a pipelining stage between each second or third stage. The number of pipelining stages does not change the principle.

Because of the pipelining there is a phase shift of the output signal with regard to the phase_word in the digital phase-locked loop 100. This can be compensated either by correcting the phase_word by the constant latency of the output by adding or subtracting a constant to the phase_word being applied to the loop filter 40 or 40' or by subtracting or adding a constant to the dto_status being used for the oscilloscope part of the digital ramp oscillator or discrete time oscillator 50.

In FIG. 1 two digital-to-time converters 60, 62 or 60', 62' are depicted delivering two different clock signals derived from the same digital ramp oscillator or discrete time oscillator 50 or 50'. This is possible if the adders in the oscilloscope parts of the DTO 50 or 50' are splitted into a L[east]S[ignificant]B[it] part 502 and a M[ost]S[ignificant]B[it] part 504 with different overflow.

In principle with this approach any rational ratio between the frequencies of the output signals ho1 and ho2 of the digital-to-time converters 60, 62 or 60', 62' in FIG. 1 can be realized having a relation to the increment inc of the digital ramp oscillator or discrete time oscillator 50 (cf. above equation $f_{DTO}=f_{xtal} \cdot inc/dto\_max$ and steepness $\partial f_{DTO}/\partial inc=f_{xtal}/dto\_max$) or 50' (cf. above steepness $\partial f_{DTO}/\partial dto\_max=f_{xtal} \cdot inc/dto\_max^2$).

If the adders are splitted up into more than two parts also more than two overflow bits ob or most significant bits msb and therefore more than two output signals ho1, ho2, ho3, . . . , hon can be supported by one DTO 50 or 50' (thus two outputs ho1, ho2 being not a minimum requirement; the present invention can also be adopted for one, two, three, . . . n outputs ho1, ho2, ho3, . . . , hon).

If the output signal ho1, ho2 comprises a frequency which cannot be generated via the same increment inc from above equation $f_{DTO}=f_{xtal} \cdot inc/dto\_max$, then the increment inc can be scaled to another frequency and a further oscilloscope digital ramp oscillator or oscilloscope discrete time oscillator 50 or 50' can be used.

Also in this case a clock will be generated comprising a fixed frequency relation to the input signal ha. The phase will vary from edge of the input signal ha to edge of the input signal ha in fixed pattern if there is no integer ratio between input frequency and output frequency.

If the frequency resolution is not high enough the increment inc of the DTO 50 or 50' can be modulated. So with the same bit width a higher resolution is possible.

For a clock signal the output of the oscilloscope DTO 50 or 50' (overflow bits $ob_{LSB}$ of the L[east]S[ignificant]B[it] part 502) is usually taken directly. A reference signal being sampled afterwards is usually too short for safe sampling. Therefore the output of the oscilloscope DTO 50 or 50' can be elongated by any means.

One simple method is to find a "1" in the phase_word and to replace the "0"s representing time intervals after the leading edge of the output signal by "1"s until a certain number of system clock cycles clk_sys is reached or until a certain number of reference clock cycles being generated by the digital-to-time converters 60, 62 or 60', 62' is reached; this can already be calculated out of the phase_word of the clock DTC.

This is also illustrated in FIG. 14. The output of the OR-gate is "1" as long as the output of a6, b6 or c6 (cf. FIG. 13) is "1". If there is only a single "1" in the first shift register chain 64a the output is "1" for a clock cycle phi_a, phi_b or phi_c.

If there would be a second "1" in a neighbored cell in the second shift register chain 64b or in the third shift register chain 64c, the output would be kept at "1" until the chain gets empty again. This can be used to generate certain duty cycle conditions.

In this case the output of the oscilloscope DTO 50 or 50' has to be modified to the requirements. This can be done by a look-up table or just by shifting the output by several positions in the bits and ordering the shifted and non-shifted word.

In FIG. 14 there is a further example indicated by signal values in parentheses and dashed signals showing how a signal can be elongated, for instance to enable resampling with a lower clock frequency in a different clock domain. To achieve this the phase_word is changed at all higher order bits of the phase_word being also set to "1".

With the next system clock clk_sys a phase_word is generated containing only "1". So the three shift register chains 64a, 64b, 64c will never be empty. This can be continued until the pulse is long enough.

If for example a certain length of the output pulse compared to a second signal is required, which is generated by a second digital-to-time converter, then it is possible for example to count the "1"s in the phase_word applied to this second digital-to-time converter.

All bits from the start position of the signal until the last valid pulse found is set to "1":

| clk_sys | phase_word of first DTC 60, 60' | phase_word of second DTC 62, 62' |
|---|---|---|
| n | 010000100010000100 | 000000111111111111 |
| n + 1 | 001000100001000010 | 111111111111111111 |
| n + 2 | 001000010000100001 | 111111111111111111 |
| n + 3 | 000100001000100000 | 111111111111111111 |
| n + 4 | 100001000010001000 | 111111111110000000 |
| n + 5 | 010000100001000100 | 000000000000000000 |

In this example the output signal starts; with the rising edge of the output signal, the second digital-to-time converter 62 or 62' starts with the rising edge of one signal of the first digital-to-time converter 60 or 60' and ends with the falling edge of another signal of the first digital-to-time converter 60 or 60'.

If there is always the same number of "1"s in the first DTC 60, 60' between the first "1" and the last "1" in the phase_word of the second DTC 62, 62' the output pulse of the second DTC 62, 62' lasts for the same number of clock cycles of the output of the first DTC 60, 60'. Furthermore it is possible to realize certain phase conditions between the output of the first DTC 60, 60' and the second DTC 62, 62'.

Another method of generating a duty cycle of fifty percent has already been described above with respect to the oscilloscope digital ramp oscillator or oscilloscope discrete time oscillator 50 in FIG. 20. If the M[ost]S[ignificant]B[it]s are taken the output signal comprises a duty cycle of fifty percent. This is also valid for the sub-DTO. The M[ost]S[ignificant]B[it] part of the DTO 50 still gets the overflow bit ob.

As already mentioned before every other number of phases can be used, for example four phases, six phases or eight phases. With increasing number of phases the frequency for reaching the same resolution decreases with increasing effort for the phase calculation, for example output of the time-to-digital converter 20 or 20' or phase_word.

Regarding the achievable resolutions, in the past jitter amplitudes peak-to-peak have been achieved with digital systems in the range of 200 picoseconds to one nanosecond, depending on operation point, on temperature, on process spread etc.

In the present sub-clock or sub-pixel accurate phase-measurement and phase-generation circuit 100 as illustrated in FIGS. 1 to 22, the exemplarily chosen frequencies are 122.88 Megahertz for the system clock clk_sys, and 737.28 MHz for the clock cycles phi_a, phi_b, phi_c.

Because of the eighteen stages of the time-to-digital converter 20 or 20' and of the digital-to-time converters 60, 62 or 60', 62' (six stages per clock phase phi_a, phi_b, phi_c) the frequency of the virtual clock grid is 2.21 Gigahertz. This gives a resolution of about 450 picoseconds.

Higher resolutions are possible. In this case the maximum output frequency is restricted by the use of only three phases. If six clock phases including the inverted three phase-clocks are used resolutions of about 230 picoseconds can be reached. This is in the order of best case in case of the Picture Improved Combined Network Digital Phase-Locked Loop (PICNIC-DPLL).

Furthermore the frequency of the three-phase clock and/or of the system clock clk_sys can be increased to 1.1 Gigahertz. This is the limit of the current three-phase clock multiplier phase-locked loop.

So with the current approach and with the current process in principle a resolution of 150 picoseconds is possible; however, there are restrictions by layout; this means that the layout has to be able to handle a skew between the three phases of 300 picoseconds.

One solution to have this output frequency is to have two digital-to-time converter 60, 62 or 60', 62':

one of these digital-to-time converters is used to generate the rising edge of a clock, the other of these digital-to-time converters is used to generate the falling edge of a clock.

This can easily be achieved if the two outputs of the digital-to-time converter 60, 62 or 60', 62' in FIG. 1 are applied to an XOR-gate and if the inputs of the digital-to-time converter 60, 62 or 60', 62' in FIG. 1 are on the same frequency but shifted by a proper number of clock cycles, for example one subclock cycle.

Then the output of the XOR-gate can run on half the virtual clock frequency.

Another possibility is to have a three-input XOR-gate. If there is a "1" in the shift register at the same position at two clock phases at the same position the first clock phase reaching the input of the XOR-gate sets the output to "1", and the second clock phase sets the output to "0" again.

This can be done by shifting the phase_word by one position or more to the left and bitwise OR-gating this with the original version. If it is necessary special attention has to be paid to the duty cycle.

Instead of a XOR-gate also a latch can be used being controlled by two digital-to-time converter 60, 62 or 60', 62':
  one of these digital-to-time converters can be used for setting the latch,
  the other of these digital-to-time converters can be used to reset it again.

The phase shift between the phase images of the digital-to-time converter 60, 62 or 60', 62' determines the output timing of the signal.

A further solution is to have more than three clock phases. So keeping the frequency of these multiple clock phases can be in a lower frequency range but the skew between these clock phases becomes smaller. By doing this, the effort for the time-to-digital converter 20 or 20' and for the digital-to-time converter 60, 62 or 60', 62' is increased, but with relaxed timing constraints higher resolution values are possible.

With the present approach (one digital-to-time converter and OR-gate or NAND-gate at the output) it is only possible to generate frequencies smaller than the half of the frequency of the subphase.

If the output signal is generated by means of a latch or with a XOR-gate so that the generation of the rising edge and of the falling edge can be controlled separately it is possible to generate output frequencies equal to or smaller than the product of the number of subphases times the half frequency of the subphases.

Apart from the solutions as presented above, the present invention includes also a feasible solution to increase the limit frequency of the circuit system 100 to subclock grid frequency.

A maximum output frequency in the order of half of the subclock frequency can be achieved if the output of the digital-to-time converter 60, 62 or 60', 62' is changed such that the output does not have a duration of three subclock intervals but a duration of only one subclock interval; such alternative implementation for getting half of the subclock frequency as output frequency is illustrated in FIGS. 17, 18, 19:

The content of the last F[lip]F[lop] (<--> reference numeral 1aFF) in the chain 64a or 64a' is "1" for one interval of the first clock phase phi_a; thus, usually the maximum possible frequency is $f_{phi\_a}/2$. If the output is combined with other phases then also higher frequencies are possible.

As depicted in FIG. 17, in a first case c1 (cf. also FIG. 19) where the output of the first shift register chain 64a or 64a' is logically combined ("ANDed") with the third clock phase phi_c by a first AND-gate 68a or 68a', the high period of the output is one sixth of an interval of the first clock phase phi_a. Accordingly,
  the output of the second shift register chain 64b or 64b' is logically combined ("ANDed") with the first clock phase phi_a by a second AND-gate 68b or 68b', with the high period of the output being one sixth of an interval of the second clock phase phi_b; and
  the output of the third shift register chain 64c or 64c' is logically combined ("ANDed") with the second clock phase phi_b by a third AND-gate 68c or 68c', with the high period of the output being one sixth of an interval of the third clock phase phi_c;
thus, all output of all shift registers 64a, 64b, 64c or 64a', 64b', 64c' can be shortened to reach higher frequencies.

To summarize, in the first case c1 of FIG. 17 in general the output of the chain 64a, 64b, 64c or 64a', 64b', 64c' of one clock phase is logically ANDed with the preceding clock edge or clock signal phi_c, phi_a, phi_b. An OR-gate 72 or 72' is provided with the respective output signals 70a, 70b, 70c or 70a', 70b', 70c' of the AND-gates 68a, 68b, 68c or 68a', 68b', 68c', with the output signal clk_out of digital-to-time converter 60, 62 or 60', 62' resulting from this OR-gate 72 or 72'.

As depicted in FIG. 18, in a second case c2 (cf. also FIG. 19) where the high period of the output is intended to be double as long as in the first case c1 of FIG. 17, the output of each chain 64a, 64b, 64c or 64a', 64b', 64c' can be logically ANDed with the inverted signal of the succeeding clock edge or clock signal phi_b, phi_c, phi_a; in more detail,
  the output of the first shift register chain 64a or 64a' is logically combined ("ANDed") with the inverted second clock phase phi_b by a first AND-gate 68a or 68a', with the high period of the output being one third of an interval of the first clock phase phi_a;
  the output of the second shift register chain 64b or 64b' is logically combined ("ANDed") with the inverted third clock phase phi_c by a second AND-gate 68b or 68b', with the high period of the output being one third of an interval of the second clock phase phi_b; and
  the output of the third shift register chain 64c or 64c' is logically combined ("ANDed") with the inverted first clock phase phi_a by a third AND-gate 68c or 68c', with the high period of the output being one third of an interval of the third clock phase phi_c;
thus, all output of all shift registers 64a, 64b, 64c or 64a', 64b', 64c' can be shortened to reach higher frequencies.

To summarize, in the second case c2 of FIG. 18 in general the output of the chain 64a, 64b, 64c or 64a', 64b', 64c' of one clock phase is logically ANDed with the inverted signal of the succeeding clock edge or clock signal phi_b, phi_c, phi_a. An OR-gate 72 or 72' is provided with the respective output signals 70a, 70b, 70c or 70a', 70b', 70c' of the AND-gates 68a, 68b, 68c or 68a', 68b', 68c', with the output signal clk_out of digital-to-time converter 60, 62 or 60', 62' resulting from this OR-gate 72 or 72'.

All in all, the advantage of the present sub-clock or sub-pixel accurate phase-measurement and phase-generation circuit 100 as illustrated in FIGS. 1 to 22 is that there is less analog circuitry in a digital environment that is less susceptible for noise and ground bounce.

This kind of clock generation can be used to generate any clock signal dependent on or independent of an input reference signal. The output frequency is determined by the equation $f_{DTO} = f_{xtal} \cdot inc/dto\_max$. So any rational ratio between the increment inc and the maximum content or maximum value dto_max of the discrete time oscillator or oscilloscope digital time oscillator 50 can be realized.

If the increment inc is modulated from clock to clock also "dithering" to a higher resolution is possible. The frequency of the virtual clock grid determines the minimum possible jitter.

As illustrated above, different implementations
of the time-to-digital converter 20 (cf. FIGS. 8, 9: first embodiment without sample-and-hold stages) or 20' (cf. FIGS. 10, 11, 12: second embodiment with sample-and-hold stage ss),
of the filter 40 (cf. FIG. 2: first embodiment with P[roportional] control) or 40' (cf. FIG. 3: second embodiment with P[roportional]I[ntegral] control),
of the digital ramp oscillator or discrete time oscillator 50 (cf. FIGS. 4, 5: first embodiment without control of flyback value or maximum content or maximum value dto_max; cf. also FIG. 20: embodiment without pipelining and without splitting of adder units; FIG. 21: embodiment with pipelining but without splitting of adder units; FIG. 22: embodiment without pipelining but with splitting of adder units 502, 504) or 50' (cf. FIGS. 6, 7: second embodiment with control of flyback value or maximum content or maximum value dto_max), and/or
of the digital-to-time converter 60, 62 (cf. FIGS. 13, 14: first embodiment without sample-and-hold stages) or 60', 62' (cf. FIGS. 15, 16: second embodiment with sample-and-hold stage ss),
have been shown. This shows that the principle of the circuits TDC 20 or 20' and DTC 60, 62 or 60', 62' can be implemented with different approaches with different timing constraints.

There is also a lot of freedom to derive different output signals with less additional effort from the same source without using an analog clock multiplier phase-locked-loop.

LIST OF REFERENCE NUMERALS

| | |
|---|---|
| 100 | circuit arrangement, in particular sub-clock or sub-pixel accurate phase-measurement and phase-generation circuit |
| 10 | phase measurement unit |
| 20 | time-to-digital converter unit of phase measurement unit 10 |
| 20' | time-to-digital converter unit with sample-and-hold stage ss |
| 22a | first shift register unit, in particular first shift register chain, of time-to-digital converter unit 20 |
| 22a' | first shift register unit, in particular first shift register chain, of time-to-digital converter unit 20' |
| 22b | second shift register unit, in particular second shift register chain, of time-to-digital converter unit 20 |
| 22b' | second shift register unit, in particular second shift register chain, of time-to-digital converter unit 20' |
| 22c | third shift register unit, in particular third shift register chain, of time-to-digital converter unit 20 |
| 22c' | third shift register unit, in particular third shift register chain, of time-to-digital converter unit 20' |
| 24 | decoder unit, in particular tally decoder unit, of time-to-digital converter unit 20, 20' |
| 26 | rising edge detector unit of time-to-digital converter unit 20 |
| 30 | phase detector unit of phase measurement unit 10 |
| 40 | filter unit, in particular loop filter unit, with P[roportional] control |
| 40' | filter unit, in particular loop filter unit, with P[roportional]I[ntegral] control |
| 40i' | integral path of loop filter unit 40' |
| 40p' | proportional path of loop filter unit 40' |
| 42 | proportional element of loop filter unit 40 |
| 42' | proportional element of loop filter unit 40' |
| 42o' | output signal of proportional path 40p', in particular of proportional element 42' |
| 44' | integral element of loop filter unit 40' |
| 44o' | output signal of integral element 44' |
| 46' | delay element, in particular fed-back delay element, of integrator module 46', 48b' |
| 46o' | output signal of integral path 40i', in particular of delay element 46' |
| 48a' | first adder unit, in particular for adding output signal 42o' of proportional path 40p' to output signal 46o' of integral path 40i' |
| 48b' | second adder unit, in particular for adding output signal 44o' of integral element 44' to output signal 46o' of integral path 40i' |
| 50 | digital ramp oscillator unit or discrete time oscillator unit, in particular oscilloscope digital ramp oscillator unit or oscilloscope discrete time oscillator unit |
| 50' | digital ramp oscillator unit or discrete time oscillator unit, in particular oscilloscope digital ramp oscillator unit or oscilloscope discrete time oscillator unit, with control of flyback value or maximum content or maximum value dto_max |
| 50c | conventional digital ramp oscillator unit or conventional discrete time oscillator unit |
| 52 | adder unit of digital ramp oscillator unit or discrete time oscillator unit 50 |
| 52' | adder unit of digital ramp oscillator unit or discrete time oscillator unit 50' |
| 54 | register unit of digital ramp oscillator unit or discrete time oscillator unit 50 |
| 54' | register unit of digital ramp oscillator unit or discrete time oscillator unit 50' |
| 56' | comparator unit of digital ramp oscillator unit or discrete time oscillator unit 50' |
| 58' | subtractor unit of digital ramp oscillator unit or discrete time oscillator unit 50' |
| 502 | L[east]S[ignificant]B[it] part of adder of digital ramp oscillator unit or discrete time oscillator unit 50, 50' |
| 504 | M[ost]S[ignificant]B[it] part of adder of digital ramp oscillator unit or discrete time oscillator unit 50, 50' |
| 60 | first digital-to-time converter unit |
| 60' | first digital-to-time converter unit with sample-and-hold stage ss |
| 62 | second digital-to-time converter unit |
| 62' | second digital-to-time converter unit with sample-and-hold stage ss |
| 64a | first shift register unit, in particular first shift register chain, of digital-to-time converter unit 60, 62 |
| 64a' | first shift register unit, in particular first shift register chain, of digital-to-time converter unit 60', 62' |
| 64b | second shift register unit, in particular second shift register chain, of digital-to-time converter unit 60, 62 |
| 64b' | second shift register unit, in particular second shift register chain, of digital-to-time converter unit 60', 62' |
| 64c | third shift register unit, in particular third shift register chain, of digital-to-time converter unit 60, 62 |
| 64c' | third shift register unit, in particular third shift register chain, of digital-to-time converter unit 60', 62' |
| 66 | rising edge detector of digital-to-time converter unit 60, 62 |
| 68 | AND-gate of digital-to-time converter unit 60, 62 |
| 68' | NAND-gate of digital-to-time converter unit 60', 62' |
| 68a | first AND-gate of digital-to-time converter unit 60, 62 |
| 68a' | first AND-gate of digital-to-time converter unit 60', 62' |
| 68b | second AND-gate of digital-to-time converter unit 60, 62 |
| 68b' | second AND-gate of digital-to-time converter unit 60', 62' |
| 68c | third AND-gate of digital-to-time converter unit 60, 62 |
| 68c' | third AND-gate of digital-to-time converter unit 60', 62' |
| 70a | output signal of first AND-gate 68a |
| 70a' | output signal of first AND-gate 68a' |
| 70b | output signal of second AND-gate 68b |
| 70b' | output signal of second AND-gate 68b' |
| 70c | output signal of third AND-gate 68c |
| 70c' | output signal of third AND-gate 68c' |
| 72 | OR-gate of digital-to-time converter 60, 62 |
| 72' | OR-gate of digital-to-time converter 60', 62' |
| bi | bit image of sub-clock phases |
| c1 | first case |
| c2 | second case |
| clk_out | output signal of digital-to-time converter 60, 62, 60', 62' |
| clk_sys | system clock of circuit arrangement 100 |
| clk_sys_out | system clock output signal |
| delta_phi | output of phase detector 30 |
| div | divider unit |
| dto_co | carry out signal of digital ramp oscillator or discrete time oscillator 50, 50' |
| dto_max | flyback value or maximum content or maximum value of digital ramp oscillator or discrete time oscillator 50, 50' |
| dto_reg | content or value of register unit 54, 54' |

-continued

LIST OF REFERENCE NUMERALS

| | |
|---|---|
| dto_status | output signal of digital ramp oscillator or discrete time oscillator 50, 50', in particular status signal of register unit 54, 54' |
| f | frequency (=1/time period T) |
| $f_{clk}$ | frequency of clock signal |
| $f_{DTO}$ | frequency of digital ramp oscillator or discrete time oscillator 50, 50' |
| fiFF | first latch unit, in particular first F[lip]F[lop] |
| ha | input signal of phase measurement unit 10, in particular of time-to-digital converter 20 |
| ho1 | first output signal, in particular output signal of first digital-to-time converter 60, 60' |
| ho2 | second output signal, in particular output signal of second digital-to-time converter 62, 62' |
| i1 | first implementation |
| i2 | second implementation |
| inc | increment = output signal of loop filter 40, 40' |
| is | input stage |
| Ki | integral coefficient or integral factor of integral element 44' |
| Kp | proportional coefficient or proportional factor of proportional element 42' |
| laFF | last latch unit, in particular last F[lip]F[lop] |
| lcpi | line and clock phase information |
| msb | most significant bit of digital ramp oscillator or discrete time oscillator 50, 50' |
| ob | overflow bit of digital ramp oscillator or discrete time oscillator 50, 50' |
| $ob_{LSB}$ | overflow bit of L[east]S[ignificant]B[it] part 502 of adder unit of digital ramp oscillator unit or discrete time oscillator unit 50, 50' |
| $ob_{MSB}$ | overflow bit of M[ost]S[ignificant]B[it] part 504 of adder unit of digital ramp oscillator unit or discrete time oscillator unit 50, 50' |
| os | output stage |
| phase_word | phase word |
| $phi_{clk}$ | phase of clock signal |
| phi_a | first clock cycle or first clock phase |
| phi_b | second clock cycle or second clock phase |
| phi_c | third clock cycle or third clock phase |
| re | rising edge re of system clock clk_sys |
| rs1 | first resample stage or first resampling stage |
| rs2 | second resample stage or second resampling stage |
| rs3 | third resample stage or third resampling stage |
| s1 | first stage |
| s2 | second stage |
| s3 | third stage |
| s4 | fourth stage |
| s5 | fifth stage |
| s6 | sixth stage |
| sample_a | first sample signal |
| sample_b | second sample signal |
| sample_c | third sample signal |
| shs | sample-and-hold stage |
| sp | sampling point |
| ss | shift stage |
| t | time |
| T | time period (=1/frequency f) |
| tdc_out | output signal or output value of time-to-digital converter 20 |
| vad | very accurate design |

The invention claimed is:

1. A circuit arrangement, in particular a phase-locked loop for sub-clock or sub-pixel accurate phase-measurement and phase-generation, characterized by at least one phase measurement unit, in particular comprising at least one time-to-digital converter unit being provided with at least one input signal and at least one phase detector unit being provided with at least one output signal of the time-to-digital converter unit; at least one loop filter unit being provided with at least one output signal of the phase detector unit; at least one digital ramp oscillator unit or discrete time oscillator unit being provided with at least one output signal, in particular with at least one increment, of the loop filter unit, the status signal of at least one register unit of the digital ramp oscillator unit or discrete time oscillator unit being fed back as input signal to the phase detector unit; and at least one digital-to-time converter unit being provided with at least one output signal of the digital ramp oscillator unit or discrete time oscillator unit and generating at least one output signal, wherein the time-to-digital converter unit includes at least two shift register chains configured to process the input signal as an input of the shift register chains.

2. The circuit arrangement according to claim 1, characterized in that the time-to-digital converter unit comprises, in particular three, shift register chains wherein, at least two, in particular three, clock cycles or clock phases are applied to the shift register chains, and at least one latch unit, in particular at least one flip flop unit, is provided for phase measurement wherein the number of the latch units is related to the frequency ratio of the clock cycles or clock phases and of the system clock of the circuit arrangement; that the output of at least one of the shift register chains is resampled with at least one of the clock cycles or clock phases in order to have a relaxed timing in the circuit arrangement; and/or that the output of the time-to-digital converter unit comprises at least one decoder unit, in particular at least one tally decoder unit for converting the generated thermometer code to a binary number, for example by the means of at least one look-up table.

3. A circuit arrangement, in particular a phase-locked loop for sub-clock or sub-pixel accurate phase-measurement and phase-generation, characterized by at least one phase measurement unit, in particular comprising at least one time-to-digital converter unit being provided with at least one input signal and at least one phase detector unit being provided with at least one output signal of the time-to-digital converter unit; at least one loop filter unit being provided with at least one output signal of the phase detector unit; at least one digital ramp oscillator unit or discrete time oscillator unit being provided with at least one output signal, in particular with at least one increment, of the loop filter unit, the status signal of at least one register unit of the digital ramp oscillator unit or discrete time oscillator unit being fed back as input signal to the phase detector unit; and at least one digital-to-time converter unit being provided with at least one output signal of the digital ramp oscillator unit or discrete time oscillator unit and generating at least one output signal, characterized in that the time-to-digital converter additionally comprises at least one sample-and-hold stage being provided between at least one shift stage and at least one output stage and guaranteeing a save crossing between all clock domains, the output of the sample-and-hold stage staying constant for one period of the system clock output signal.

4. The circuit arrangement according to claim 1, characterized in that the digital-to-time converter unit comprises in particular three, shift register chains wherein at least two, in particular three, clock cycles or clock phases are applied to the shift register chains, and at least one latch unit, in particular at least one flip flop unit, is provided, the at least one first latch unit in each shift register chain being triggered by different clock domains in order to transfer at least one phase word being also applied to the digital-to-time converter from the domain of the system clock to the phase domain; that the clock cycles or clock phases split the interval of the system clock into subintervals, the number of subintervals depending on the number of clock cycles or clock phases and on the frequency relation between the system clock and the subphases; that the phase word is derivable from at least one look-up table, from the digital ramp oscillator unit or discrete time oscillator unit or from at least one memory unit in which at least one certain pattern can be calculated and/or stored, the phase word being generated for each clock cycle of the system clock and being loaded at one clock cycle or clock phase into the related shift register chain; and/or that at least one rising edge detector unit is applied to the system clock, the output signal of the rising edge detector unit being applied to at least one AND-gate unit, the output signal of the AND-gate being applied to the first register unit in the shift register chains.

5. A circuit arrangement, in particular a phase-locked loop for sub-clock or sub-pixel accurate phase-measurement and phase-generation, characterized by at least one phase measurement unit, in particular comprising at least one time-to-digital converter unit being provided with at least one input signal and at least one phase detector unit being provided with at least one output signal of the time-to-digital converter unit; at least one loop filter unit being provided with at least one output signal of the phase detector unit; at least one digital ramp oscillator unit or discrete time oscillator unit being provided with at least one output signal, in particular with at least one increment, of the loop filter unit, the status signal of at least one register unit of the digital ramp oscillator unit or discrete time oscillator unit being fed back as input signal to the phase detector unit; and at least one digital-to-time converter unit being provided with at least one output signal of the digital ramp oscillator unit or discrete time oscillator unit and generating at least one output signal, characterized in that resampling is done in the digital-to-time converter unit in order to ensure that the words, in particular the phase words, are available at the correct sub-clock phase and in order to avoid timing violations; and/or that the digital-to-time converter unit additionally comprises at least one sample-and-hold stage being provided between at least one input stage and at least one output stage, the input stage taking over the data from the digital ramp oscillator unit or discrete time oscillator unit and keeping the data stable for at least one period of the system clock output signal during which period of the system clock output signal the data can safely be loaded into the shift stage.

6. The circuit arrangement according to claim 1, characterized in that the digital ramp oscillator unit or discrete time oscillator unit receives at least one increment from the loop filter unit or from another source, and is designed for calculating the bit image of the sub-clock phases with the last status signal of the register unit as input for the digital-to-time converter unit, the bit image representing the level of the output signal related to a virtual clock grid with a clock frequency being a multiple of the number of stages in the digital-to-time converter unit, in particular a multiple of the frequency of the clock cycle or clock phase or a multiple of the frequency of the system clock, the status after at least one first adder unit representing the status of the phase one virtual clock cycle after the last active edge of the system clock, the status after at least one second adder unit representing the status of the phase two virtual clock cycles after the last active edge of the system clock, the status after at least one penultimate adder unit representing the status of the phase one virtual clock cycle before the next active edge of the system clock.

7. A circuit arrangement, in particular a phase-locked loop for sub-clock or sub-pixel accurate phase-measurement and phase-generation, characterized by at least one phase measurement unit, in particular comprising at least one time-to-digital converter unit being provided with at least one input signal and at least one phase detector unit being provided with at least one output signal of the time-to-digital converter unit; at least one loop filter unit being provided with at least one output signal of the phase detector unit; at least one digital ramp oscillator unit or discrete time oscillator unit being provided with at least one output signal, in particular with at least one increment, of the loop filter unit, the status signal of at least one register unit of the digital ramp oscillator unit or discrete time oscillator unit being fed back as input signal to the phase detector unit; and at least one digital-to-time converter unit being provided with at least one output signal of the digital ramp oscillator unit or discrete time oscillator unit and generating at least one output signal, characterized in that an additional stage of pipelining, in particular between each stage, is introduced into the digital ramp oscillator unit or discrete time oscillator unit, every latch unit being clocked with the system clock, the increment being delayed with at least one additional latch unit, in particular with at least one additional flip flop unit, between each adder unit in order to make new increment propagating through the stages while the calculation of the bit images with the latch units is going on in the last stages, the overflow bits and/or the most significant bits being collected in the latch units the number of which increasing from stage to stage because of the number of accomplished overflow bits and/or of accomplished most significant bits also increasing, that because of the additional stage of pipelining at least one phase shift of the output signal with regard to the phase word can be compensated by correcting the phase word by at least one constant latency of the output signal by adding or by subtracting at least one constant to the phase word being applied to the loop filter unit or by subtracting or by adding at least one constant to the status signal of the register unit being used for the oscilloscope part of the digital ramp oscillator unit or discrete time oscillator unit; and/or that at least two different clock signals are derivable from the same digital ramp oscillator unit or discrete time oscillator by splitting the digital ramp oscillator unit or discrete time oscillator unit, in particular the oscilloscope part of the digital ramp oscillator unit or discrete time oscillator unit, into at least two parts, in particular into at least one L[east]S[ignificant]B[it] part and at least one M[ost]Significant]B[it] part with different overflow in order to provide any rational ratio between the frequencies of the output signals of the digital-to-time converters.

8. A method for sub-clock or sub-pixel accurate phase-measurement and phase-generation, in particular for generating any clock signal dependent on or independent of an input reference signal, characterized by the output frequency of at least one loop filter unit being determined by any rational ratio of at least one output signal, in particular of at least one increment, of the loop filter unit, and the maximum content or maximum value of at least one digital ramp oscillator unit or discrete time oscillator unit, in particular by the maximum output frequency being in the order of half of the sub-clock frequency in case the output signal of a digital-to-time converter unit comprises a duration of about one sub-clock interval.

9. The method according to claim 8, characterized in that the clock signal is derived from the phase from at least one input signal, that no clock multiplier phase-locked loop is provided behind the time-to-digital converter unit that neither an analog delay line nor a signal divider unit is provided between the digital ramp oscillator unit or discrete time oscillator unit and the digital-to-time converter unit, wherein less analog circuitry is susceptible for noise and for ground bounce in the digital environment.

10. A method comprising: using at least one circuit arrangement for sub-clock and/or sub-pixel accurate phase measurement and phase generation, in particular for digital clock synthesis or for complete digital generation of reference signals for facilitating display operations of at least one digital video processor unit, wherein said at least one circuit arrangement is constructed and arranged to include a phase-locked loop for sub-clock or sub-pixel accurate phase-measurement and phase-generation, characterized by at least one phase measurement unit, in particular including at least one time-to-digital converter unit being provided with at least one input signal and at least one phase detector unit being provided with at least one output signal of the time-to-digital converter unit; at least one loop filter unit being provided with at least one output signal of the phase detector unit; at least one digital ramp oscillator unit or discrete time oscillator unit being provided with at least one output signal, in particular with at least one increment, of the loop filter unit, the status signal of at least one register unit of the digital ramp oscillator unit or discrete time oscillator unit being fed back as input signal to the phase detector unit; and at least one digital-to-time converter unit being provided with at least one output signal of the digital ramp oscillator unit or discrete time oscillator unit and generating at least one output signal, wherein the time-to-digital converter unit includes at least two shift register chains configured to process the input signal as an input of the shift register chains.

* * * * *